US010608558B2

(12) United States Patent
Ichimura

(10) Patent No.: US 10,608,558 B2
(45) Date of Patent: Mar. 31, 2020

(54) WAFER, PIEZOELECTRIC VIBRATOR ELEMENT, AND PIEZOELECTRIC VIBRATOR

(71) Applicant: SII Crystal Technology Inc., Chiba-shi, Chiba (JP)

(72) Inventor: Naoya Ichimura, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 306 days.

(21) Appl. No.: 15/704,539

(22) Filed: Sep. 14, 2017

(65) Prior Publication Data
US 2018/0091066 A1 Mar. 29, 2018

(30) Foreign Application Priority Data

Sep. 29, 2016 (JP) .................. 2016-190823

(51) Int. Cl.
H02N 2/00 (2006.01)
H03H 9/215 (2006.01)
H03H 9/10 (2006.01)
H01L 41/053 (2006.01)
H01L 41/09 (2006.01)
H01L 41/253 (2013.01)
H01L 41/29 (2013.01)
H01L 41/338 (2013.01)
H03H 3/04 (2006.01)
H03H 9/13 (2006.01)

(52) U.S. Cl.
CPC .......... H02N 2/005 (2013.01); H01L 41/053 (2013.01); H01L 41/0986 (2013.01); H01L 41/253 (2013.01); H01L 41/29 (2013.01); H01L 41/338 (2013.01); H02N 2/002 (2013.01); H02N 2/0075 (2013.01); H02N 2/22 (2013.01); H03H 3/04 (2013.01); H03H 9/1014 (2013.01); H03H 9/13 (2013.01); H03H 9/215 (2013.01); H03H 2003/0492 (2013.01)

(58) Field of Classification Search
CPC combination set(s) only.
See application file for complete search history.

(56) References Cited

U.S. PATENT DOCUMENTS

2009/0058232 A1* 3/2009 Takahashi .......... G01C 19/5607
310/370
2009/0077781 A1* 3/2009 Amano .................... H03H 3/02
29/25.35

(Continued)

FOREIGN PATENT DOCUMENTS

JP 2009-194630 A 8/2009

Primary Examiner — Bryan P Gordon
(74) Attorney, Agent, or Firm — Brinks Gilson & Lione

(57) ABSTRACT

There is provided a wafer making it possible to stably break off the piezoelectric vibrator element. The wafer includes a piezoelectric vibrator element, a frame part, and a connection part adapted to connect the piezoelectric vibrator element and the frame part to each other, and the connection part is provided with a guide part adapted to guide force, which is applied to the connection part from one surface side in the thickness direction of the connection part when breaking off the piezoelectric vibrator element from the frame part at the connection part, to at least one side in the width direction of the connection part.

18 Claims, 12 Drawing Sheets

(56) References Cited

U.S. PATENT DOCUMENTS

| | | | |
|---|---|---|---|
| 2009/0205178 A1* | 8/2009 | Kobayashi | H03H 3/02 29/25.35 |
| 2014/0077663 A1* | 3/2014 | Kobayashi | H03H 9/1021 310/344 |
| 2014/0368087 A1* | 12/2014 | Hiraoka | G02B 26/0858 310/345 |

* cited by examiner

WAFER, PIEZOELECTRIC VIBRATOR ELEMENT, AND PIEZOELECTRIC VIBRATOR

RELATED APPLICATIONS

This application claims priority under 35 U.S.C. § 119 to Japanese Patent Application No. 2016-190823 filed on Sep. 29, 2016, the entire content of which is hereby incorporated by reference.

FIELD OF THE INVENTION

The present invention relates to a wafer, a piezoelectric vibrator element, and a piezoelectric vibrator.

BACKGROUND OF THE INVENTION

In recent years, due to the miniaturization of the electronic device, a demand for miniaturization of the piezoelectric vibrator and the piezoelectric vibrator element is more and more increasing. For example, in JP-A-2009-194630, there is disclosed a technology of using a wafer made of a piezoelectric material to manufacture a plurality of piezoelectric vibrator elements in a lump. The wafer is provided with a plurality of piezoelectric vibrator elements, a frame part, and a connection part for connecting the piezoelectric vibrator element and the frame part to each other. For example, the piezoelectric vibrator elements are broken off from the frame part at the connection part, then land on a mounting stage, and are then conveyed to the next process while being suction supported.

However, in the case in which the piezoelectric vibrator elements are miniaturized, the way of cracking the connection part when breaking off the piezoelectric vibrator element becomes apt to vary. Therefore, the landing posture of the piezoelectric vibrator element on the mounting stage becomes apt to vary. If the landing posture of the piezoelectric vibrator element is inappropriate, it becomes difficult to suction support and convey the piezoelectric vibrator element, and there is a possibility that the yield ratio decreases. Therefore, in the conventional wafer, there is a room for improvement in stably breaking off the piezoelectric vibrator element.

The invention addresses the above problem and has an advantage of providing a wafer, a piezoelectric vibrator element, and a piezoelectric vibrator each making it possible to stably break off the piezoelectric vibrator element.

SUMMARY OF THE INVENTION

A wafer according to an aspect of the invention includes a piezoelectric vibrator element, a frame part, and a connection part adapted to connect the piezoelectric vibrator element and the frame part to each other, and the connection part is provided with a guide part adapted to guide force, which is applied to the connection part from one surface side in a thickness direction of the connection part when breaking off the piezoelectric vibrator element from the frame part at the connection part, to at least one side in a width direction of the connection part.

According to this configuration, since the force applied thereto from the one surface side in the thickness direction of the connection part when breaking off the piezoelectric vibrator element is guided to at least one side in the width direction of the connection part, the way of cracking the connection part becomes apt to be stabilized. Therefore, it is possible to stably break off the piezoelectric vibrator element.

In the wafer described above, it is possible that the guide part has a tilted surface tilted with respect to one surface in the thickness direction of the connection part so that an inner side of the tilted surface in the thickness direction of the connection part is located on an outer side in the width direction of the connection part.

According to this configuration, since the force applied thereto from the one surface side in the thickness direction of the connection part when breaking off the piezoelectric vibrator element is guided along the tilted surface, the way of cracking the connection part becomes more apt to be stabilized. Therefore, it is possible to more stably break off the piezoelectric vibrator element.

In the wafer described above, it is possible that the guide part has a triangular shape having a vertex angle on an outer side in the width direction of the connection part in a cross-sectional view of the connection part.

Incidentally, in the case of simply adopting a rectangular shape as the cross-sectional shape of the connection part, when breaking off the piezoelectric vibrator element, the way of cracking the connection part is not fixed, and there is a high possibility that the piezoelectric vibrator element cannot stably be broken off. In contrast, according to this configuration, the guide parts each have the triangular shape having the vertex angle on the outer side in the width direction of the connection part in the cross-sectional view of the connection part. Therefore, since the cracks are guided along the oblique sides of the triangular shapes when breaking off the piezoelectric vibrator element, the way of cracking the connection part becomes more apt to be stabilized. Therefore, it is possible to more stably break off the piezoelectric vibrator element.

In the wafer described above, it is possible that a degree of the vertex angle is no smaller than 30 degrees and no larger than 120 degrees.

Incidentally, in the case in which the degree of the vertex angle exceeds 120 degrees, the width of the guide parts in the width direction of the connection part becomes too thin, and there is a high possibility that the connection part breaks in an unintended situation due to insufficient strength. On the other hand, in the case in which the degree of the vertex angle is smaller than 30 degrees, the thickness of the guide parts in the thickness direction of the connection part becomes too thin, and there is a high possibility that the connection part breaks in an unintended situation due to insufficient strength. In contrast, according to this configuration, since the degree of the vertex angle is no smaller than 30 degrees and no larger than 120 degrees, the strength of the connection part is sufficiently ensured. Therefore, it is possible to prevent the connection part from breaking in an unintended situation.

In the wafer described above, it is possible that the connection part further includes a main body part having a rectangular shape in a cross-sectional view of the connection part, and the guide part is disposed on at least one of one side surface and the other side surface in a width direction of the main body part.

According to this configuration, since the force applied thereto from the one surface side in the thickness direction of the connection part when breaking off the piezoelectric vibrator element is guided to at least one side in the width direction of the connection part starting from the main body part, the way of cracking the connection part becomes more apt to be stabilized. Therefore, it is possible to more stably break off the piezoelectric vibrator element.

In the wafer described above, it is possible that the main body part projects outward in the thickness direction of the connection part from the guide part in the cross-sectional view of the connection part.

According to this configuration, since the force applied thereto from the one surface side in the thickness direction of the connection part when breaking off the piezoelectric vibrator element is guided to at least one side in the width direction of the connection part starting from the projected part of the main body part, the way of cracking the connection part becomes more apt to be stabilized. Therefore, it is possible to more stably break off the piezoelectric vibrator element.

In the wafer described above, it is possible that the guide part includes a first guide part disposed on one side surface in the width direction of the main body part, and a second guide part disposed on the other side surface in the width direction of the main body part.

According to this configuration, since the force applied thereto from the one surface side in the thickness direction of the connection part when breaking off the piezoelectric vibrator element is guided to the both sides in the width direction of the connection part starting from the main body part, the way of cracking the connection part becomes more apt to be stabilized. Therefore, it is possible to more stably break off the piezoelectric vibrator element.

In the wafer described above, it is possible that the first guide part and the second guide part form a line-symmetrical shape with a central line in the width direction of the main body part as a line of symmetry in the cross-sectional view of the connection part.

According to this configuration, since the force applied thereto from the one surface side in the thickness direction of the connection part when breaking off the piezoelectric vibrator element is guided to the both sides in the width direction of the connection part in a balanced manner starting from the main body part, the way of cracking the connection part becomes more apt to be stabilized. Therefore, it is possible to more stably break off the piezoelectric vibrator element.

In the wafer described above, it is possible that the first guide part and the second guide part have respective shapes different from each other in the cross-sectional view of the connection part.

According to this configuration, since the force applied thereto from the one surface side in the thickness direction of the connection part when breaking off the piezoelectric vibrator element becomes apt to be guided to just one side in the width direction of the connection part starting from the main body part, the crack becomes apt to occur in a local area (i.e., a brittle part of the connection part) of the connection part. Therefore, it is possible to easily break off the piezoelectric vibrator element. Therefore, it is possible to prevent the piezoelectric vibrator element from being damaged when breaking off the piezoelectric vibrator element.

In the wafer described above, it is possible that defining a width of the connection part as $W1$ and a width of the main body part as $W2$ in the cross-sectional view of the connection part, the following is satisfied.

$$10 \ \mu m < W2 \times 2 < W1 < 100 \ \mu m$$

Incidentally, in the case in which the width $W1$ of the connection part is equal to or larger than 100 μm, the crack becomes apt to start from the guide parts when breaking off the piezoelectric vibrator element, and there is a high possibility that the piezoelectric vibrator element cannot stably be broken off. On the other hand, in the case in which the width $W2$ of the main body part is equal to or smaller than 10 the width of the main body part becomes too thin, and there is a high possibility that the connection part breaks in an unintended situation due to the insufficient strength. Further, in the case in which $W2 \times 2 \geq W1$ is fulfilled, the width of the connection part becomes too thin, and there is a high possibility that the connection part breaks in an unintended situation due to the insufficient strength. In contrast, according to the present configuration, since the following is fulfilled, it becomes hard for the cracks to start from the guide parts when breaking off the piezoelectric vibrator element.

$$10 \ \mu m < W2 \times 2 < W1 < 100 \ \mu m$$

In other words, since the crack becomes apt to occur starting from the main body part when breaking off the piezoelectric vibrator element, it is possible to stably break off the piezoelectric vibrator element. In addition, since the strength of the connection part is sufficiently ensured, it is possible to prevent the connection part from breaking in an unintended situation.

In the wafer described above, it is possible that there are further included a pair of extending electrodes electrically connected to a pair of excitation electrodes, which are adapted to vibrate a pair of vibrating arm parts when a predetermined drive voltage is applied to the pair of excitation electrodes, one of the pair of extending electrodes is disposed on one side surface in the width direction of the connection part, and the other of the pair of extending electrodes is disposed on the other side surface in the width direction of the connection part.

According to this configuration, since it is possible to prevent the pair of extending electrodes from coming close to each other compared to the case of disposing both of the pair of extending electrodes on one surface in the thickness direction of the connection part, it is possible to prevent the pair of extending electrodes from shorting to each other. In addition, since the width of the connection part can be made narrower, it is possible to easily break off the piezoelectric vibrator element. Therefore, it is possible to prevent the piezoelectric vibrator element from being damaged when breaking off the piezoelectric vibrator element.

A piezoelectric vibrator element according to an aspect of the invention includes a pair of vibrating arm parts, a base part adapted to connect base ends of the pair of vibrating arm parts to each other, and a connection part to which the base part is connected, and the connection part is provided with a guide part adapted to guide force, which is applied to the connection part from one surface side in a thickness direction of the connection part when breaking off the piezoelectric vibrator element at the connection part, to at least one side in a width direction of the connection part.

According to this configuration, since the force applied thereto from the one surface side in the thickness direction of the connection part when breaking off the piezoelectric vibrator element is guided to at least one side in the width direction of the connection part, the way of cracking the connection part becomes apt to be stabilized. Therefore, it is possible to stably break off the piezoelectric vibrator element.

In the piezoelectric vibrator element described above, it is possible that the guide part has a tilted surface tilted with respect to one surface in the thickness direction of the connection part an inner side of the tilted surface in the thickness direction of the connection part is located on an outer side in the width direction of the connection part.

According to this configuration, since the force applied thereto from the one surface side in the thickness direction of the connection part when breaking off the piezoelectric vibrator element is guided along the tilted surface, the way of cracking the connection part becomes more apt to be stabilized. Therefore, it is possible to more stably break off the piezoelectric vibrator element.

In the piezoelectric vibrator element described above, it is possible that the guide part has a triangular shape having a vertex angle on an outer side in the width direction of the connection part in a cross-sectional view of the connection part.

Incidentally, in the case of simply adopting a rectangular shape as the cross-sectional shape of the connection part, when breaking off the piezoelectric vibrator element, the way of cracking the connection part is not fixed, and there is a high possibility that the piezoelectric vibrator element cannot stably be broken off. In contrast, according to this configuration, the guide parts each have the triangular shape having the vertex angle on the outer side in the width direction of the connection part in the cross-sectional view of the connection part. Therefore, since the cracks are guided along the oblique sides of the triangular shapes when breaking off the piezoelectric vibrator element, the way of cracking the connection part becomes more apt to be stabilized. Therefore, it is possible to more stably break off the piezoelectric vibrator element.

In the piezoelectric vibrator element described above, it is possible that a degree of the vertex angle is no smaller than 30 degrees and no larger than 120 degrees.

Incidentally, in the case in which the degree of the vertex angle exceeds 120 degrees, the width of the guide parts in the width direction of the connection part becomes too thin, and there is a high possibility that the connection part breaks in an unintended situation due to insufficient strength. On the other hand, in the case in which the degree of the vertex angle is smaller than 30 degrees, the thickness of the guide parts in the thickness direction of the connection part becomes too thin, and there is a high possibility that the connection part breaks in an unintended situation due to the insufficient strength. In contrast, according to this configuration, since the degree of the vertex angle is no smaller than 30 degrees and no larger than 120 degrees, the strength of the connection part is sufficiently ensured. Therefore, it is possible to prevent the connection part from breaking in an unintended situation.

In the piezoelectric vibrator element described above, it is possible that the connection part further includes a main body part having a rectangular shape in a cross-sectional view of the connection part, and the guide part is disposed on at least one of one side surface and the other side surface in a width direction of the main body part.

According to this configuration, since the force applied thereto from the one surface side in the thickness direction of the connection part when breaking off the piezoelectric vibrator element is guided to at least one side in the width direction of the connection part starting from the main body part, the way of cracking the connection part becomes more apt to be stabilized. Therefore, it is possible to more stably break off the piezoelectric vibrator element.

In the piezoelectric vibrator element described above, it is possible that the main body part projects outward in the thickness direction of the connection part from the guide part in the cross-sectional view of the connection part.

According to this configuration, since the force applied thereto from the one surface side in the thickness direction of the connection part when breaking off the piezoelectric vibrator element is guided to at least one side in the width direction of the connection part starting from the projected part of the main body part, the way of cracking the connection part becomes more apt to be stabilized. Therefore, it is possible to more stably break off the piezoelectric vibrator element.

In the piezoelectric vibrator element described above, it is possible that the guide part includes a first guide part disposed on one side surface in the width direction of the main body part, and a second guide part disposed on the other side surface in the width direction of the main body part.

According to this configuration, since the force applied thereto from the one surface side in the thickness direction of the connection part when breaking off the piezoelectric vibrator element is guided to the both sides in the width direction of the connection part starting from the main body part, the way of cracking the connection part becomes more apt to be stabilized. Therefore, it is possible to more stably break off the piezoelectric vibrator element.

In the piezoelectric vibrator element described above, it is possible that the first guide part and the second guide part form a line-symmetrical shape with a central line in the width direction of the main body part as a line of symmetry in the cross-sectional view of the connection part.

According to this configuration, since the force applied thereto from the one surface side in the thickness direction of the connection part when breaking off the piezoelectric vibrator element is guided to the both sides in the width direction of the connection part in a balanced manner starting from the main body part, the way of cracking the connection part becomes more apt to be stabilized. Therefore, it is possible to more stably break off the piezoelectric vibrator element.

In the piezoelectric vibrator element described above, it is possible that the first guide part and the second guide part have respective shapes different from each other in the cross-sectional view of the connection part.

According to this configuration, since the force applied thereto from the one surface side in the thickness direction of the connection part when breaking off the piezoelectric vibrator element becomes apt to be guided to just one side in the width direction of the connection part starting from the main body part, the crack becomes apt to occur in a local area (i.e., a brittle part of the connection part) of the connection part. Therefore, it is possible to easily break off the piezoelectric vibrator element. Therefore, it is possible to prevent the piezoelectric vibrator element from being damaged when breaking off the piezoelectric vibrator element.

In the piezoelectric vibrator element described above, it is possible that defining a width of the connection part as W1 and a width of the main body part as W2 in the cross-sectional view of the connection part, the following is satisfied.

$$10 \ \mu m < W2 \times 2 < W1 < 100 \ \mu m$$

Incidentally, in the case in which the width W1 of the connection part is equal to or larger than 100 μm, the crack becomes apt to start from the guide parts when breaking off the piezoelectric vibrator element, and there is a high possibility that the piezoelectric vibrator element cannot stably be broken off. On the other hand, in the case in which the width W2 of the main body part is equal to or smaller than 10 μm, the width of the main body part becomes too thin, and there is a high possibility that the connection part breaks in an unintended situation due to the insufficient strength. Further, in the case in which W2×2≧W1 is fulfilled, the width of the connection part becomes too thin, and there is a high possibility that the connection part breaks in an unintended situation due to the insufficient strength. In contrast, according to the present configuration, since the following is fulfilled, it becomes hard for the cracks to start from the guide parts when breaking off the piezoelectric vibrator element.

$$10\ \mu m < W2 \times 2 < W1 < 100\ \mu m$$

In other words, since the crack becomes apt to occur starting from the main body part when breaking off the piezoelectric vibrator element, it is possible to stably break off the piezoelectric vibrator element. In addition, since the strength of the connection part is sufficiently ensured, it is possible to prevent the connection part from breaking in an unintended situation.

In the piezoelectric vibrator element described above, it is possible that there are further included a pair of extending electrodes electrically connected to a pair of excitation electrodes, which are adapted to vibrate a pair of vibrating arm parts when a predetermined drive voltage is applied to the pair of excitation electrodes, one of the pair of extending electrodes is disposed on one side surface in the width direction of the connection part, and the other of the pair of extending electrodes is disposed on the other side surface in the width direction of the connection part.

According to this configuration, since it is possible to prevent the pair of extending electrodes from coming close to each other compared to the case of disposing both of the pair of extending electrodes on one surface in the thickness direction of the connection part, it is possible to prevent the pair of extending electrodes from shorting to each other. In addition, since the width of the connection part can be made narrower, it is possible to easily break off the piezoelectric vibrator element. Therefore, it is possible to prevent the piezoelectric vibrator element from being damaged when breaking off the piezoelectric vibrator element.

A piezoelectric vibrator according to an aspect of the invention includes any one of the piezoelectric vibrator element described above, and a package adapted to house the piezoelectric vibrator element.

According to this configuration, in the piezoelectric vibrator equipped with any one of the piezoelectric vibrator elements described above, the piezoelectric vibrator element can stably be broken off.

According to the invention, it is possible to provide the wafer, the piezoelectric vibrator element and the piezoelectric vibrator each making it possible to stably break off the piezoelectric vibrator element.

DETAILED DESCRIPTION OF THE INVENTION

Figure 1:
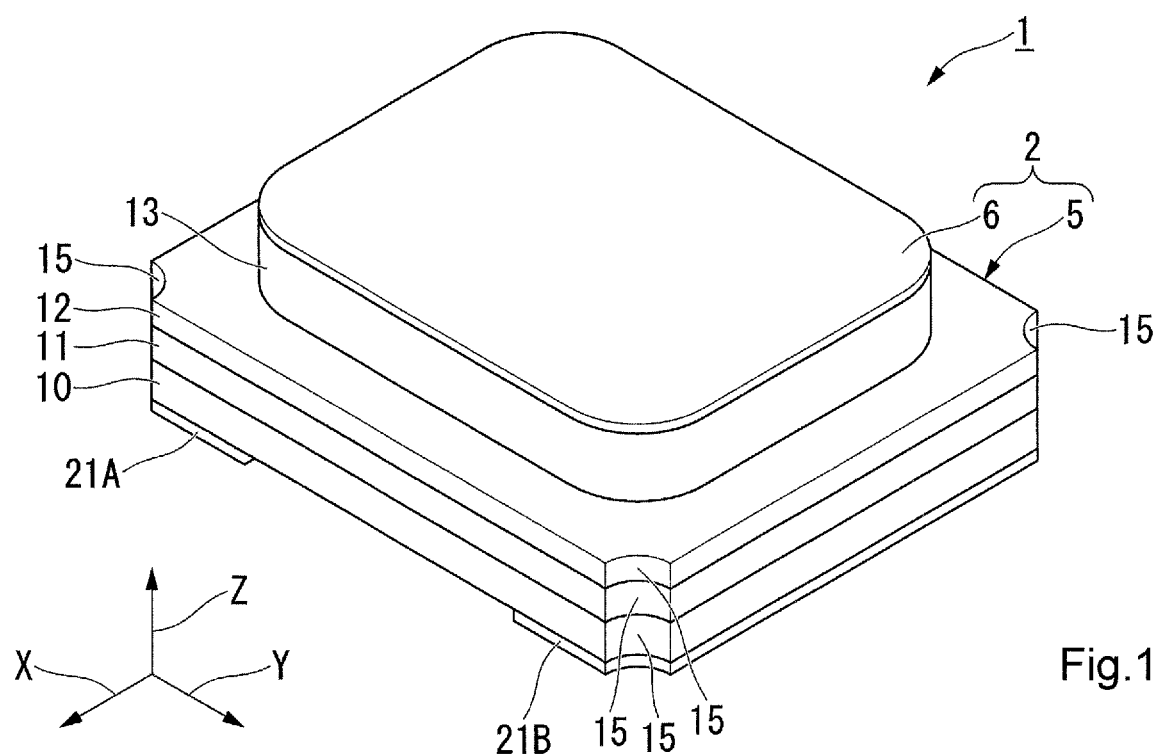
FIG. 1 is an exterior perspective view of a piezoelectric vibrator according to an embodiment of the invention.

An embodiment according to the invention will hereinafter be described with reference to the accompanying drawings. In the following embodiment, explanations will be presented citing a ceramic-package type surface-mounting vibrator as an example of the piezoelectric vibrator. It should be noted that the scale size of each member is accordingly altered so that the member is shown large enough to recognize in the drawings used in the following description.

In the following descriptions, an XYZ coordinate system is defined, and positional relationships between the respective members will be described with reference to the XYZ coordinate system. In this case, a direction (i.e., the thickness direction of the piezoelectric vibrator element) perpendicular to the principal surface of the piezoelectric vibrator element is defined as a "Z-axis direction," the longitudinal direction (i.e., the longitudinal direction of the piezoelectric vibrator element) of a vibrating arm part is defined as a "Y-axis direction," and a direction (i.e., the width direction of the piezoelectric vibrator element) perpendicular to the Y-axis direction and the Z-axis direction is defined as an "X-axis direction."

[Piezoelectric Vibrator]

As shown in FIG. 1, the piezoelectric vibrator 1 is provided with a package 2 incorporating a cavity C hermetically sealed (see FIG. 2), and a piezoelectric vibrator element 3 (see FIG. 2) housed in the cavity C.

Figure 2:
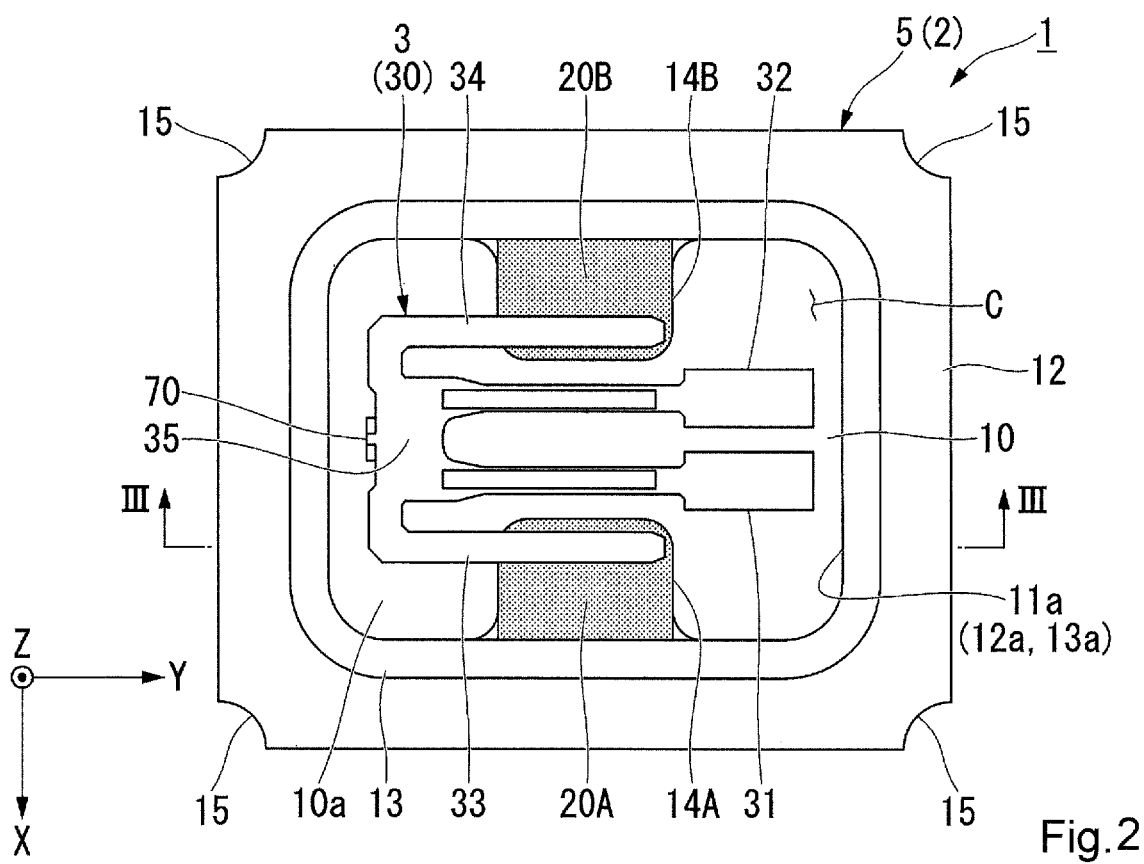
FIG. 2 is an internal configuration diagram of the piezoelectric vibrator according to the embodiment.

As shown in FIG. 2, the piezoelectric vibrator element 1 has a rectangular shape in a planar view. In the present embodiment, the longitudinal direction, the width direction, and the thickness direction of the piezoelectric vibrator 1 coincide with the longitudinal direction (the Y-axis direction), the width direction (the X-axis direction), and the thickness direction (the Z-axis direction) of the piezoelectric vibrator element 3, respectively.

[Package]

Figure 3:
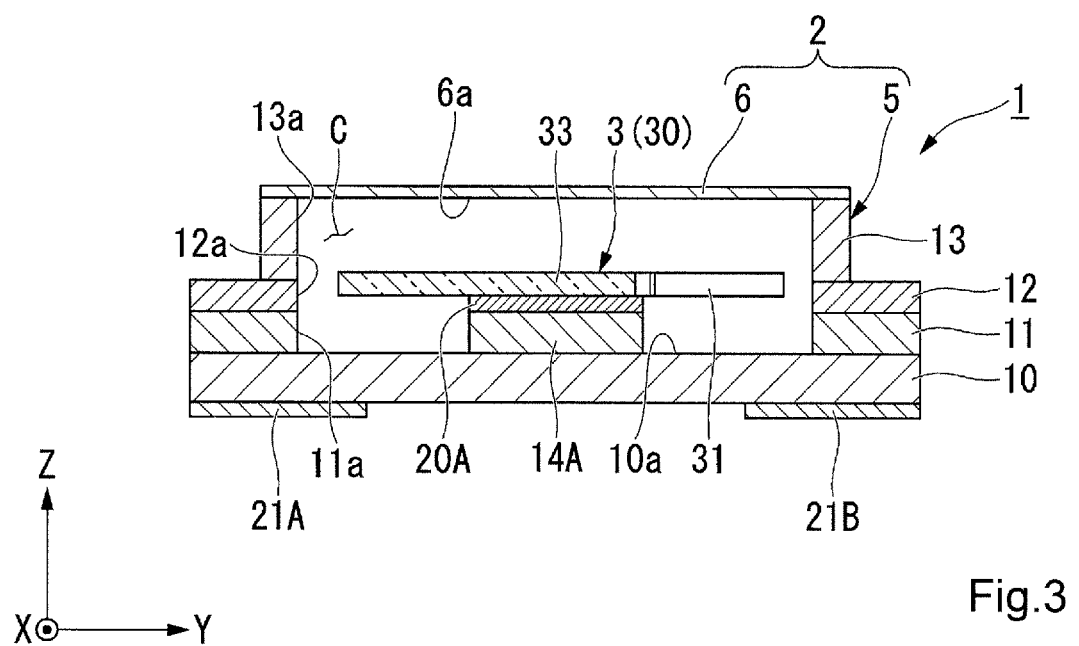
FIG. 3 is a cross-sectional view along the line shown in FIG. 2.

As shown in FIG. 3, the package 2 is provided with a package main body 5, and a sealing plate 6, which is bonded to the package main body 5, and at the same time forms the cavity C between the sealing plate 6 and the package main body 5.

The package main body 5 is provided with a first base substrate 10 having a plate-like shape, a second base substrate 11 having a frame-like shape, and bonded to the first base substrate 10, a third base substrate 12 having a frame-like shape, and bonded to the second base substrate 11, and a sealing ring 13 having a frame-like shape, and bonded to the third base substrate 12.

Figure 4:
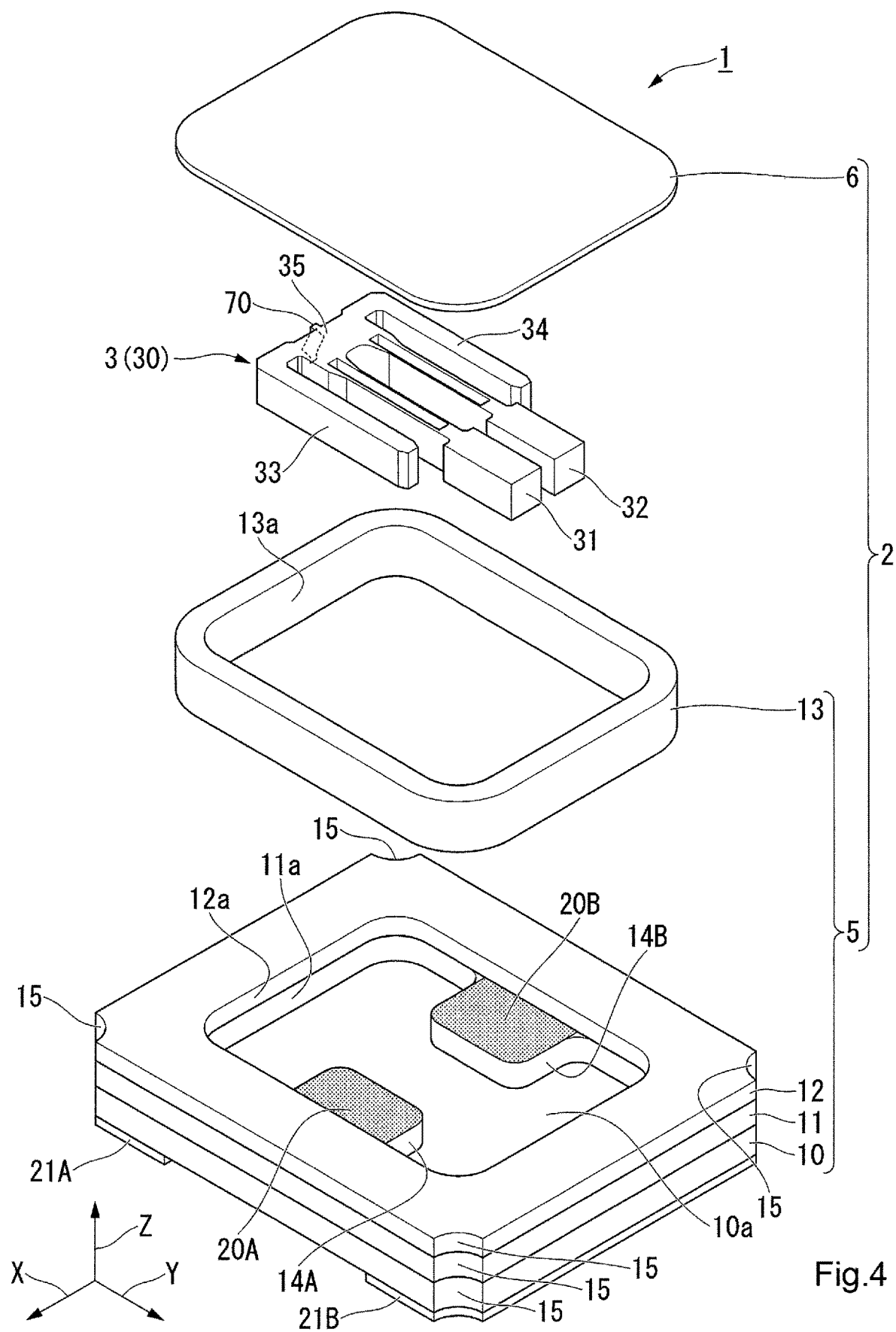
FIG. 4 is an exploded perspective view of the piezoelectric vibrator according to the embodiment.

As shown in FIG. 4, on the four corners of the first base substrate 10, the second base substrate 11, and the third base substrate 12, there are formed cutout parts 15 each having a quarter arc-like shape in a planar view. The cutout parts 15 are each formed throughout the entire thickness of the first base substrate 10, the second base substrate 11, and the third base substrate 12. For example, the first base substrate 10, the second base substrate 11, and the third base substrate 12 are manufactured by bonding three wafer-like ceramic substrates so as to overlap each other, then forming a plurality of through holes, which penetrate the ceramic substrates and are arranged in a matrix, and subsequently cutting the ceramic substrates in a grid manner with reference to the through holes. The cutout parts 15 are each formed by dividing the through hole into four equal parts.

For example, as the forming material of the ceramics substrates, there can be cited HTCC (High Temperature Co-fired Ceramic) made of alumina, and LTCC (Low Temperature Co-fired Ceramic) made of glass ceramics.

As shown in FIG. 3, the outer shape of the first base substrate 10 is substantially the same as the outermost shape of the package main body 5. An upper surface 10a (the surface on the +Z-axis direction side) of the first base substrate 10 defines the bottom part of the cavity C.

As shown in FIG. 4, the outer shape of the second base substrate 11 is substantially the same as the outer shape of the first base substrate 10. The second base substrate 11 has a frame-like shape opening in the thickness direction. An inner circumferential surface 11a of the second base substrate 11 has a shape with the four corners rounded in the planar view. The inner circumferential surface 11a of the second base substrate 11 defines a part (a lower part) of the side part of the cavity C (see FIG. 3).

As shown in FIG. 3, the second base substrate 11 is disposed on the upper surface 10a of the first base substrate 10. The second base substrate 11 is integrated with the first base substrate 10. For example, the second base substrate 11 is bonded to the first base substrate 10 by sintering or the like.

As shown in FIG. 4, the second base substrate 11 is provided with mount parts 14A, 14B protruding inward in the width direction. The mount parts 14A, 14B are located in at the center in the longitudinal direction of the second base substrate 11.

The outer shape of the third base substrate 12 is substantially the same as the outer shape of the second base substrate 11. The third base substrate 12 has a frame-like shape opening in the thickness direction. An inner circumferential surface 12a of the third base substrate 12 defines a part (a central part in the vertical direction) of the side part of the cavity C (see FIG. 3).

As shown in FIG. 3, the third base substrate 12 is disposed on the upper surface of the second base substrate 11. The third base substrate 12 is integrated with the second base substrate 11. For example, the third base substrate 12 is bonded to the second base substrate 11 by sintering or the like.

As shown in FIG. 4, the sealing ring 13 has electrical conductivity. The outer shape of the sealing ring 13 is smaller than the outer shape of the third base substrate 12. The sealing ring 13 has a frame-like shape opening in the thickness direction. An inner circumferential surface 13a of the sealing ring 13 defines a part (an upper part) of the side part of the cavity C (see FIG. 3).

As shown in FIG. 3, the sealing ring 13 is bonded to the upper surface of the third base substrate 12. For example, the sealing ring 13 is bonded to the third base substrate 12 by baking with a brazing material such as silver solder or a solder material. It should be noted that the sealing ring 13 can also be bonded to a metal bonding layer, which is formed on the upper surface of the third base substrate 12, by bonding. For example, as the forming method of the metal bonding layer, there can be cited electrolytic plating, electroless plating, vapor deposition, sputtering and so on.

For example, as the forming material of the sealing ring 13, a nickel base alloy and so on can be cited. Specifically, it is sufficient for the forming material of the sealing ring 13 to be selected from kovar, elinvar, invar, 42-alloy, and so on. In particular, as the material of the sealing ring 13, it is preferable to select a material closer in thermal expansion coefficient to the forming material of the first base substrates 10 and the second base substrate 11. For example, in the case of using alumina having the thermal expansion coefficient of $6.8 \times 10^{-6}/°$ C. as the formation material of the first base substrate 10 and the second base substrate 11, kovar having the thermal expansion coefficient of $5.2 \times 10^{-6}/°$ C. or 42-alloy having the thermal expansion coefficient of $4.5 \times 10^{-6}$ through $6.5 \times 10^{-6}/°$ C. is preferably used as the sealing ring 13.

The sealing plate 6 has electrical conductivity. The outer shape of the sealing plate 6 is substantially the same as the outer shape of the sealing ring 13. A lower surface 6a (the surface on the −Z-axis direction side) of the sealing plate 6 defines the upper part of the cavity C.

The sealing plate 6 is bonded to the upper end of the sealing ring 13. For example, as the bonding method of the sealing plate 6, there can be cited seam welding by making a roller electrode have contact, laser welding, ultrasonic welding, and so on. It should be noted that from a viewpoint of more reliably bonding the sealing plate 6 and the sealing ring 13 to each other, it is preferable to form a bonding layer made of nickel or gold good in chemistry with each other on each of the outer circumferential part (i.e., the bonding surface with the sealing ring 13) of the lower surface 6a of the sealing plate 6 and the upper end (i.e., the bonding surface with the sealing plate 6) of the sealing ring 13.

The cavity C is defined by the upper surface 10a of the first base substrate 10, the inner circumferential surface 11a of the second base substrate 11, the inner circumferential surface 12a of the third base substrate 12, the inner circumferential surface 13a of the sealing ring 13, and the lower surface 6a of the sealing plate 6. Therefore, the inside of the piezoelectric vibrator 1 is airtightly sealed by the upper surface of the first base substrate 10, the inner circumferential surface 11a of the second base substrate 11, the inner circumferential surface 12a of the third base substrate 12, the inner circumferential surface 13a of the sealing ring 13, and the lower surface 6a of the sealing plate 6.

As shown in FIG. 4, on the upper surfaces of the mount parts 14A, 14B of the second base substrate 11, there are formed a pair of electrode pads 20A, 20B, respectively, which are connection electrodes to the piezoelectric vibrator element 3. Incidentally, on the lower surface of the first base substrate 10, there are formed a pair of external electrodes 21A, 21B with distance therebetween in the longitudinal direction. For example, the electrode pads 20A, 20B and the external electrodes 21A, 21B are each a single layer film made of single metal or a laminated film having different metals stacked on one another formed by vapor deposition, sputtering, or the like. The electrode pads 20A, 20B and the external electrodes 21A, 21B are electrically connected to each other via interconnections not shown.

[Piezoelectric Vibrator Element]

Figure 5:
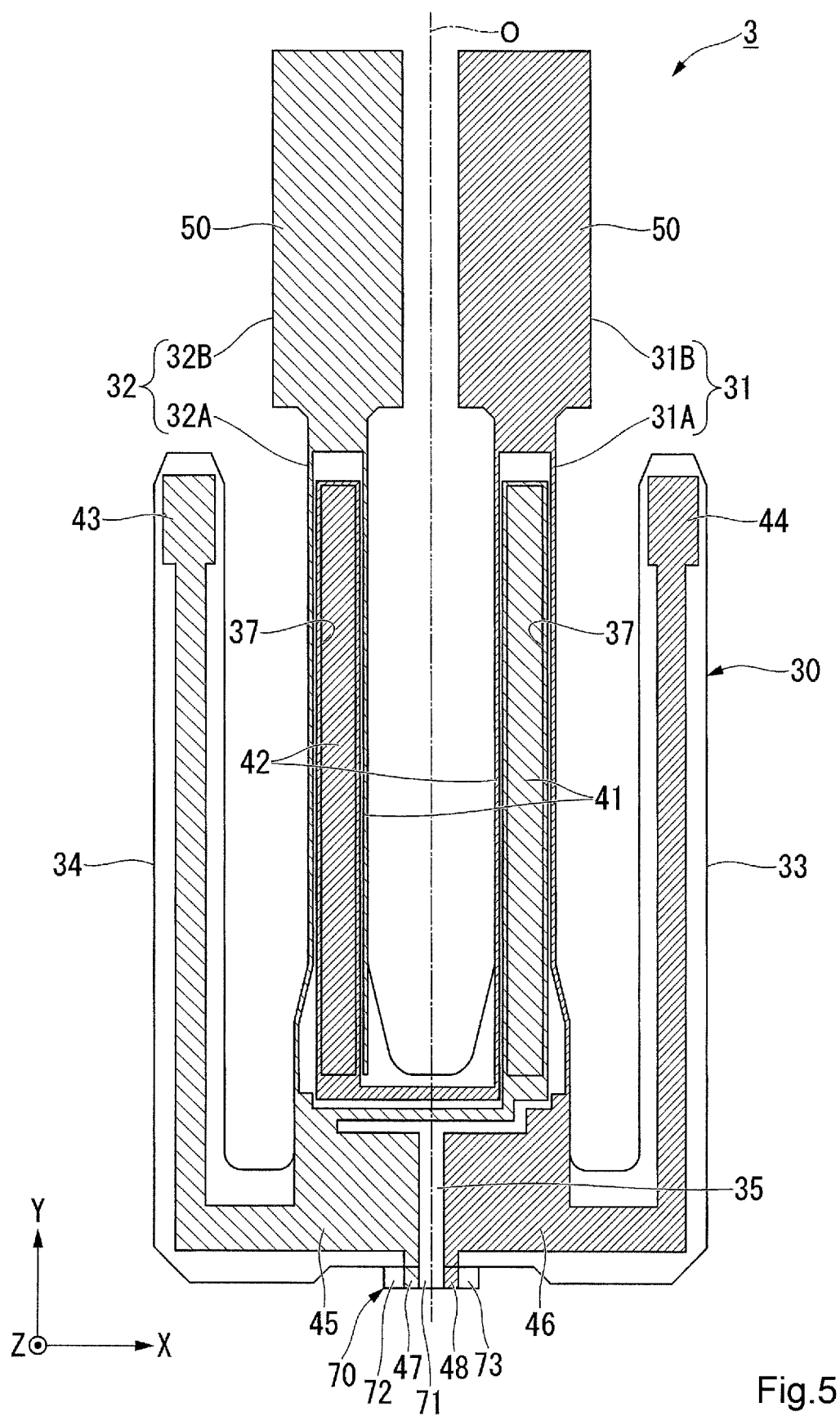
FIG. 5 is a plan view of a piezoelectric vibrator element according to the embodiment.

As shown in FIG. 5, the piezoelectric vibrator element 3 is provided with a piezoelectric plate 30, and electrodes 41 through 48 provided to the piezoelectric plate 30.

The piezoelectric plate 30 is formed of a piezoelectric material. In the present embodiment, the piezoelectric plate 30 is formed of a quartz crystal. It should be noted that the piezoelectric plate 30 can also be formed of a piezoelectric material such as a lithium tantalate, or a lithium niobate.

The piezoelectric plate 30 is provided with a pair of vibrating arm parts 31, 32 (a first vibrating arm part 31 and a second vibrating arm part 32), a base part 35 for connecting the base ends of the pair of vibrating arm parts 31, 32 to each other, a pair of support arm parts 33, 34 (a first support arm part 33 and a second support arm part 34) connected to the base part 35 and disposed on the outer side in the width direction of the pair of vibrating arm parts 31, 32, and a connection part 70 to which the base part 35 is connected. Viewed from the Z-axis direction, the piezoelectric plate 30 has a substantially line-symmetrical shape with the central axis O extending along the Y-axis direction as the axis of symmetry.

[Vibrating Arm Parts]

The vibrating arm parts 31, 32 each have the longitudinal direction along the Y-axis direction. The vibrating arm parts 31, 32 extend from the base part 35 toward the +Y-axis direction. The vibrating arm parts 31, 32 are disposed in parallel to each other while being arranged in the X-axis direction. The vibrating arm parts 31, 32 each vibrate with the base part functioning as a fixed end, and the tip functioning as a free end. The vibrating arm parts 31, 32 are provided with main body parts 31A, 32A located on the base part 35 side, and weight parts 31B, 32B located on the tip side of the vibrating arm parts 31, 32, respectively.

The main body parts 31A, 32A are each provided with a groove part 37. The groove part 37 is recessed inward in the thickness direction on the both principal surfaces (the both surfaces in the thickness direction) of each of the main body parts 31A, 31B. The groove part 37 extends throughout the longitudinal direction of each of the main body parts 31A, 32A.

In each of the main body parts 31A, 32A, there are disposed two systems of excitation electrodes (a first excitation electrode 41 and a second excitation electrode 42). The excitation electrodes 41, 42 vibrate the respective vibrating arm parts 31, 32 in the width direction when a predetermined drive voltage is applied. The excitation electrodes 41, 42 are patterned in the state of being electrically isolated from each other.

Specifically, the first excitation electrode 41 is formed in the groove part 37 of the first vibrating arm part 31, and on the both side surfaces in the width direction of the second vibrating arm part 32. On the other hand, the second excitation electrode 42 is formed on the both side surfaces in the width direction of the first vibrating arm part 31, and in the groove part 37 of the second vibrating arm part 32.

Viewed from the Z-axis direction, the weight parts 31B, 32B each have a rectangular shape having the longitudinal direction in the Y-axis direction. In the X-axis direction, the width of the weight parts 31B, 32B is larger than the width of the main body parts 31A, 32A. Thus, it is possible to increase the mass of the tip of each of the vibrating arm parts 31, 32, and at the same time, increase the inertial moment when vibrating. Therefore, compared to the piezoelectric vibrator element not provided with the weight parts 31B, 32B, it is possible to shorten the vibrating arm parts 31, 32.

The weight parts 31B, 32B are each provided with a weight metal film 50. The weight metal film 50 is formed integrally with the first excitation electrode 41 or the second excitation electrode 42. The weight metal film 50 increases the mass of the tip of each of the vibrating arm parts 31, 32. The weight metal film 50 prevents the resonant frequency from rising in the case of shortening the vibrating arm parts 31, 32.

[Support Arm Parts]

Viewed from the Z-axis direction, the support arm parts 33, 34 each have an L-shape. The support arm parts 33, 34 are disposed on the outer side in the width direction of the base part 35 and the vibrating arm parts 31, 32 (the main body parts 31A, 32A). Specifically, the support arm parts 33, 34 protrude from the both side surfaces in the width direction of the base part 35 outward in the width direction, and then extend along the longitudinal direction in parallel to the vibrating arm parts 31, 32, respectively.

The support arm parts 33, 34 are respectively provided with mount electrodes 43, 44 (a first mount electrode 43 and a second mount electrode 44) as mount parts when mounting the piezoelectric vibrator element 3 to the package main body 5. The first mount electrode 43 is disposed on the tip side of the second support arm part 34. The second mount electrode 44 is disposed on the tip side of the first support arm part 33.

The two systems of excitation electrodes 41, 42 and the two systems of mount electrodes 43, 44 are electrically connected to each other with two systems of wiring electrodes 45, 46 (a first wiring electrode 45 and a second wiring electrode 46), respectively. The first wiring electrode 45 is laid from the second support arm part 34 to the vibrating arm parts 31, 32 via the base part 35. The second wiring electrode 46 is laid from the first support arm part 33 to the vibrating arm parts 31, 32 via the base part 35. The excitation electrodes 41, 42, the mount electrodes 43, 44, and the wiring electrodes 45, 46 are formed on the both principal surfaces of the piezoelectric plate 30 so that the respective planar shapes viewed from the Z-axis direction coincide with each other.

The base part 35 is provided with a pair of extending electrodes 47, 48 (a first extending electrode 47 and a second extending electrode 48). The extending electrodes 47, 48 are electrically connected to the excitation electrodes 41, 42, respectively. The first extending electrode 47 and the second extending electrode 48 are electrically isolated from each other.

[Connection Part]

Figure 6:
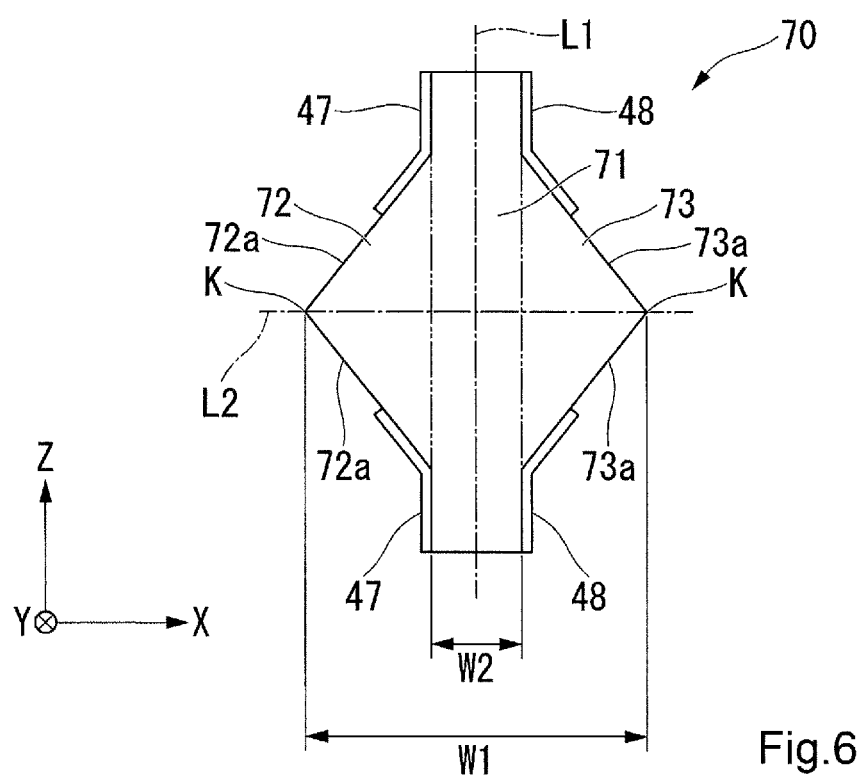
FIG. 6 is a cross-sectional view of a connection part related to the embodiment.

The connection part 70 is a part for connecting the piezoelectric vibrator element 3 (the piezoelectric plate 30 shown in FIG. 8) and a frame part 62 (see FIG. 8) described later to each other. FIG. 6 is a diagram showing the connection part 70 viewed from the −Y-axis direction. In other words, FIG. 6 shows the cross-section of the connection part 70 after the piezoelectric vibrator element 3 is broken off at the connection part 70.

As shown in FIG. 6, viewed from the −Y-axis direction (in the cross-sectional view of the connection part 70), the connection part 70 is provided with a main body part 71 having a rectangular shape, and guide parts 72, 73 (a first guide part 72 and a second guide part 73) each forming a triangular shape having a vertex angle K on the outer side in the width direction of the connection part 70. For the sake of convenience, in FIG. 6, the boundaries between the main body part 71 and the guide parts 72, 73 are indicated by the dashed two-dotted lines.

Viewed from the −Y-axis direction, the main body part 71 has a rectangular shape having the longitudinal direction in the Z-axis direction. Viewed from the −Y-axis direction, the main body part 71 projects from the guide parts 72, 73 outward in the thickness direction of the connection part 70.

The guide parts 72, 73 respectively have tilted surfaces 72a, 73a tilted with respect to one surface in the thickness direction of the connection part 70 an inner side of each of the tilted surfaces 72a, 73a in the thickness direction of the connection part 70 is located on an outer side in the width direction of the connection part 70. Viewed from the −Y-axis direction, the guide part 72 forms an isoscales triangular shape having the tilted surfaces 72a substantially the same in length as the oblique sides, and the guide part 73 forms an isoscales triangular shape having the tilted surfaces 73a substantially the same in length as the oblique sides. It should be noted that the isoscales triangular shape described above is illustrative only, the two oblique sides forming the vertex angle K can also be different in length from each other.

From the viewpoint of sufficiently ensuring the strength of the connection part 70, the degree of the vertex angle K is preferably no smaller than 30 degrees and no larger than 120 degrees. Further, from the viewpoint of more reliably ensuring the strength of the connection part 70, the degree of the vertex angle K is more preferably no smaller than 80 degrees and no larger than 100 degrees. For example, the degree of the vertex angle K in the present embodiment is about 100 degrees.

The guide parts 72, 73 are disposed on the both side surfaces in the width direction of the main body part 71, respectively. Specifically, the first guide part 72 is disposed on one side surface (the surface on the −X-axis direction side) in the width direction of the main body part 71. On the other hand, the second guide part 73 is disposed on the other side surface (the surface on the +X-axis direction side) in the width direction of the main body part 71. Viewed from the −Y-axis direction, the first guide part 72 and the second guide part 73 are disposed at the center in the longitudinal direction of the main body part 71. Viewed from the −Y-axis direction, the first guide part 72 and the second guide part 73 form a line-symmetrical shape with the central line L1 in the width direction of the main body part 71 as the line of symmetry. Viewed from the −Y-axis direction, the first guide part 72 and the second guide part 73 form a line-symmetrical shape with the central line L2 in the thickness direction of the main body part 71 as the line of symmetry.

Viewed from the −Y-axis direction, the width of the connection part 70 is denoted by W1, and the width of the main body part 71 is denoted by W2. Here, the width W1 of the connection part 70 denotes the maximum length (i.e., the distance between the vertex of the first guide part 72 and the vertex of the second guide part 73) in the X-axis direction of the connection part 70. The width W2 of the main body part 71 denotes the length between the surface on the −X-axis direction side and the surface on the +X-axis direction side of the main body part 71.

The width W1 of the connection part 70 and the width W2 of the main body part 71 satisfy the following condition.

$$10\ \mu m < W2 \times 2 < W1 < 100\ \mu m$$

The pair of extending electrodes 47, 48 (the first extending electrode 47 and the second extending electrodes 48) are laid from the principal surface of the base part 35 (see FIG. 5) to the both side surfaces in the width direction of the connection part 70. Viewed from the −Y-axis direction, the extending electrodes 47, 48 are bent along the main body part 71 and the guide parts 72, 73, respectively. The first extending electrode 47 is disposed on one side surface (the surface on the −X-axis direction side) in the width direction of the connection part 70. On the other hand, the second extending electrode 48 is disposed on the other side surface (the surface on the +X-axis direction side) in the width direction of the connection part 70. The first extending electrode 47 and the second extending electrode 48 are electrically isolated from each other.

[Connection State of Piezoelectric Vibrator Element]

As shown in FIG. 2, the piezoelectric vibrator element 3 is housed in the cavity C of the package 2 hermetically sealed. The support arm parts 33, 34 are electrically and mechanically bonded to the two electrode pads 20A, 20B provided to the mount parts 14A, 14B, respectively, via electrically-conductive adhesive. The vibrating arm parts 31, 32 are supported via the base part 35. The first mount electrode 43 (see FIG. 5) is electrically connected to the electrode pad 20B. The second mount electrode 44 (see FIG. 5) is electrically connected to the electrode pad 20A.

It should be noted that as the electrically-conductive bonding members for bonding the support arm parts 33, 34 and the electrode pads 20A, 20B to each other, it is possible to use metal bumps. The metal bumps have fluidity in the initial stage of bonding, and have a characteristic of being solidified to develop the bonding strength in a latter stage of bonding. The electrically-conductive adhesive described above also has the characteristic common to the metal bumps.

As shown in FIG. 5, when a predetermined voltage is applied to the external electrodes 21A, 21B (see FIG. 3), a current flows through the excitation electrodes 41, 42 to generate an electrical field between the excitation electrodes 41, 42. For example, the vibrating arm parts 31, 32 vibrate at a predetermined resonant frequency in directions (in the X-axis direction) of getting closer to and away from each other due to the inverse piezoelectric effect by the electrical field generated between the excitation electrodes 41, 42. For example, the vibration of the vibrating arm parts 31, 32 can be used as a time source, a timing source of a control signal, a reference signal source, or the like.

[Method of Manufacturing Piezoelectric Vibrator Element]

Then, a method of manufacturing the piezoelectric vibrator element 3 according to the present embodiment will be described.

Figure 7:
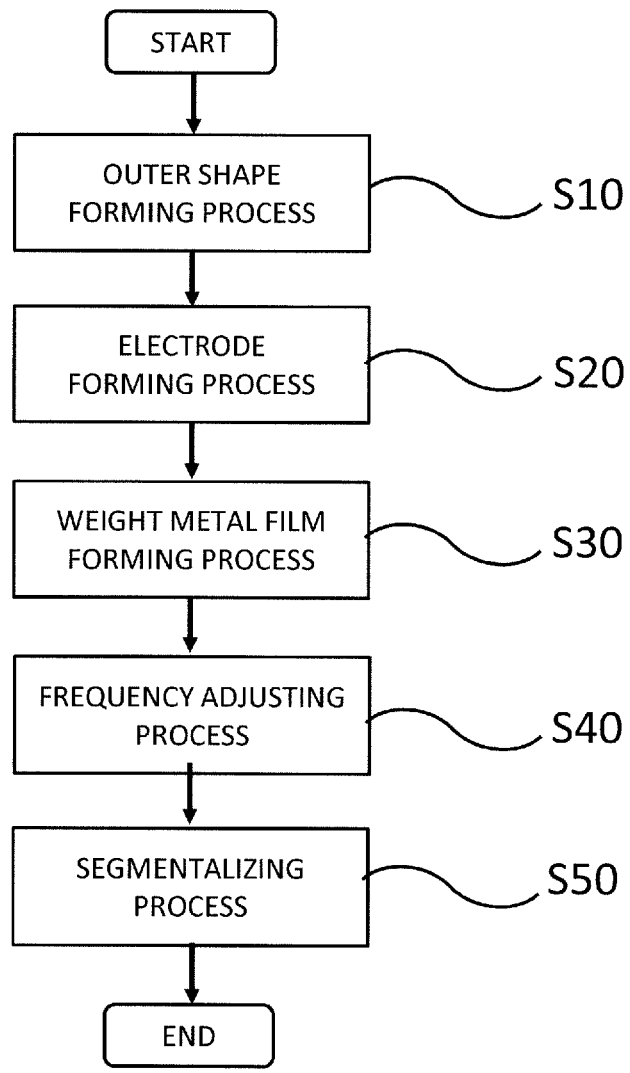
FIG. 7 is a flowchart of a method of manufacturing the piezoelectric vibrator element according to the embodiment.

As shown in FIG. 7, the method of manufacturing the piezoelectric vibrator element 3 according to the present embodiment has an outer shape forming process S10, an electrode forming process S20, a weight metal film forming process S30, a frequency adjusting process S40, and a segmentalizing process S50.

[Outer Shape Forming Process]

Figure 8:
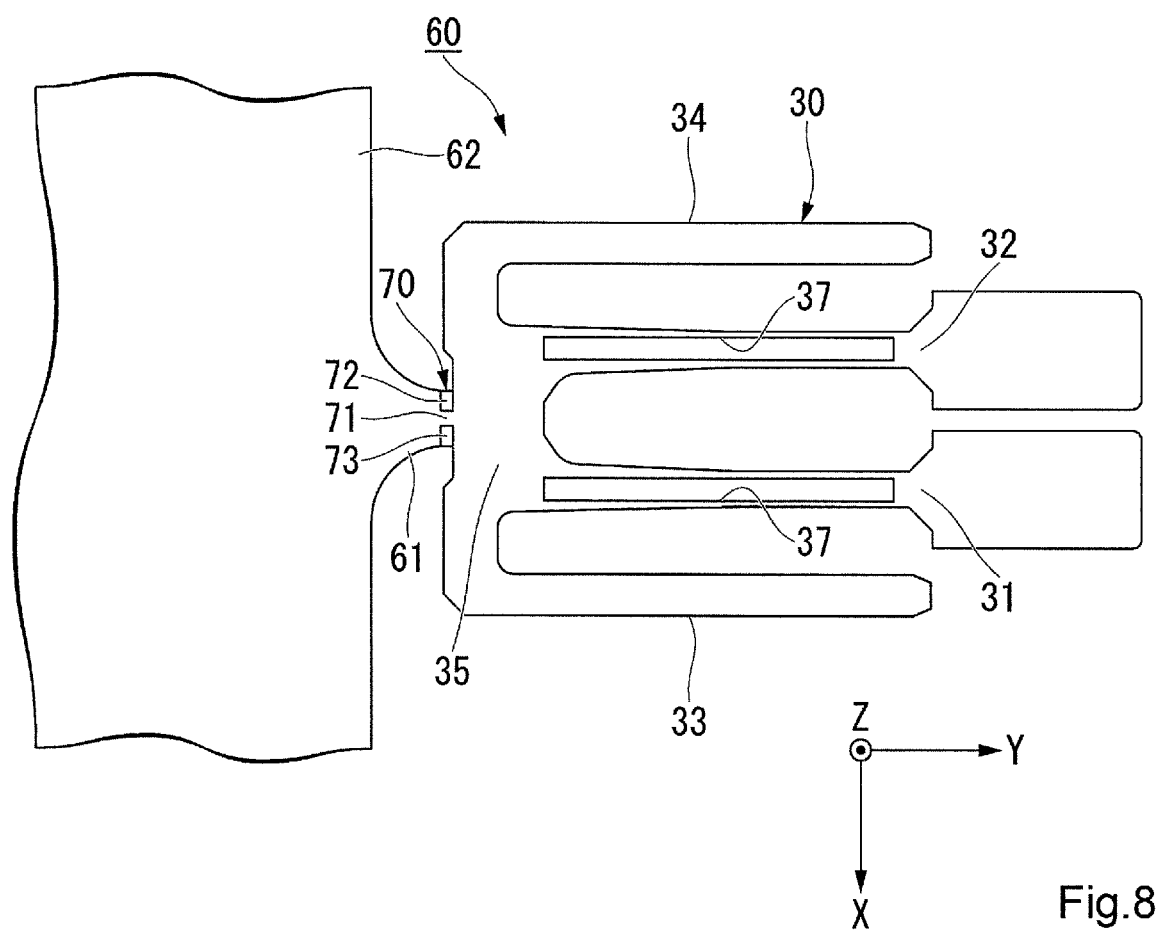
FIG. 8 is a process chart showing the method of manufacturing the piezoelectric vibrator element according to the embodiment, and is a partial plan view of a wafer.

Firstly, the outer shape forming process S10 is performed. As shown in FIG. 8, in the outer shape forming process S10, a wafer 60 is provided with a plurality of piezoelectric plates 30 (just one is shown in FIG. 8), a plurality of frame parts 62, and a plurality of connection parts 70 each for connecting the piezoelectric plate 30 and the frame part 62 to each other.

Specifically, a mask (hereinafter referred to as an "outer shape mask") having a shape corresponding to the outer shape of the piezoelectric plates 30, the frame parts 62, and the connection parts 70 is formed on the both surfaces of the wafer 60 using a photolithography technology. Subsequently, a wet-etching process is performed on the wafer 60. Thus, the area, which is not masked by the outer shape mask, is selectively removed to thereby form the outer shape of the piezoelectric plates 30, the frame parts 62, and the connection parts 70. On this occasion, the plurality of piezoelectric plates 30 (just one is shown in FIG. 8) is disposed so as to be arranged side by side in the X-axis direction, and the plurality of piezoelectric plates 30 is in the state of being connected to the frame part 62 via the respective connection parts 70. Further, among the outer surfaces of the wafer 60, the end surface (the side surface) formed by wet etching forms a natural crystal surface of the quartz crystal.

Subsequently, an etching process is performed on the vibrating arm parts 31, 32. Thus, the grooves 37 are formed on the both principal surfaces of each of the vibrating arm parts 31, 32.

Here, the connection parts 70 each connect the frame part 62 and an end edge on the −Y-axis direction side of the base part 35 to each other. The connection parts 70 are each disposed at the center in the width direction of the end edge on the −Y-axis direction side of the base part 35. A connecting part 61 between the frame part 62 and the connection part 70 projects from the frame part 62 toward the base part 35 along the Y-axis direction. The width in the X-axis direction of the connecting part 61 gradually decreases in a direction from the frame part 62 toward the base part 35. The connection part 70 becomes the narrowest in width in the part between the frame part 62 and the end edge on the −Y-axis direction side of the base part 35. For example, the width of the connection part 70 is no smaller than 30 μm and no larger than 50 μm.

[Electrode Forming Process]

Figure 9:
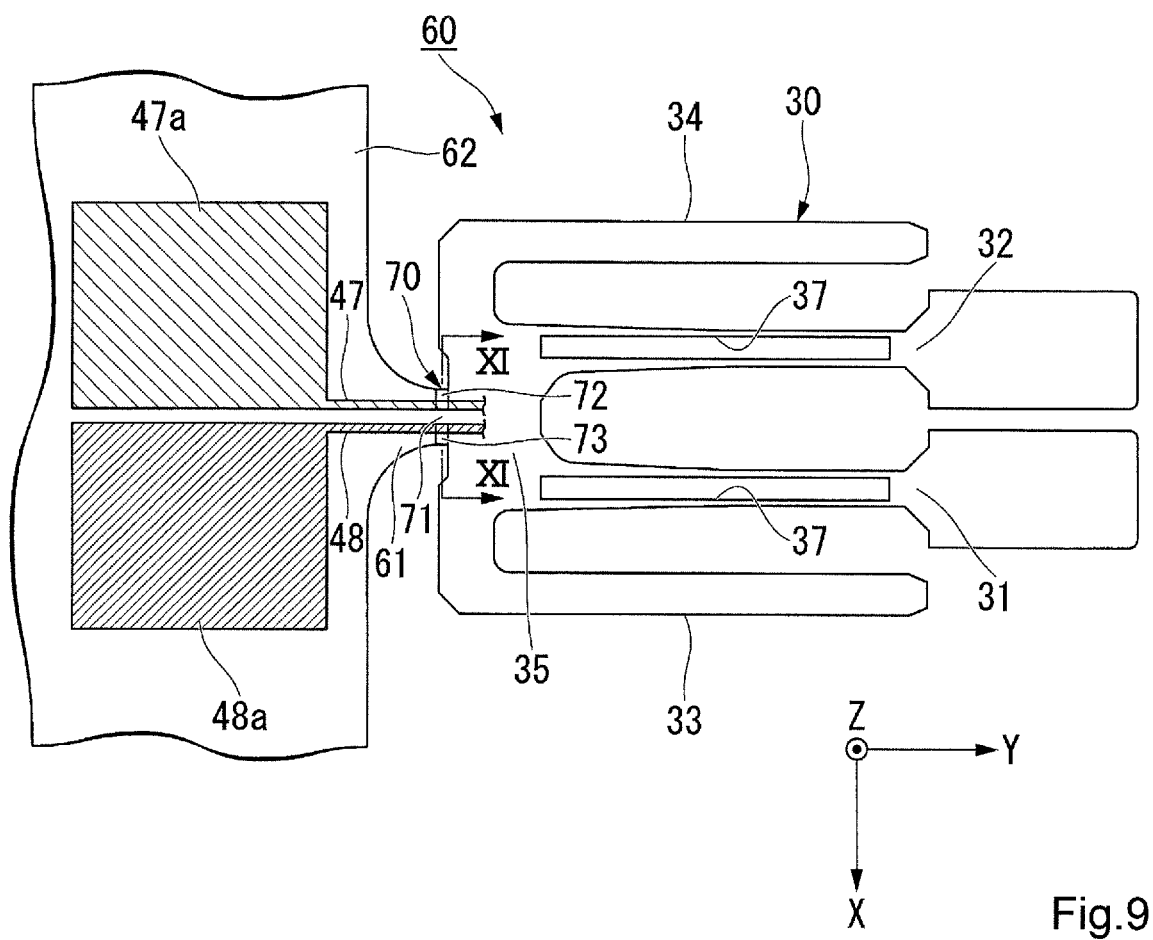
FIG. 9 is a process chart following FIG. 8, and is a partial plan view of the wafer.

Subsequently, the electrode forming process S20 is performed. As shown in FIG. 9, in the electrode forming process S20, an electrode film is patterned on the wafer 60 to form the excitation electrodes 41, 42 (see FIG. 5), the mount electrodes 43, 44 (see FIG. 5), and the wiring electrodes 45, 46 (see FIG. 5) on each of the piezoelectric plates 30, and at the same time form the extending electrodes 47, 48 extending from each of the piezoelectric plates 30 to the frame part 62 through the corresponding ones of the connection parts 70 and the connecting parts 61. It should be noted that in FIG. 9 through FIG. 11, the excitation electrodes 41, 42, the mount electrodes 43, 44, the wiring electrodes 45, 46, and the weight metal film 50 are omitted from the drawings for the sake of convenience.

Specifically, the electrode film is deposited on the principal surface and the side surface of the wafer 60 using the sputtering method, the vapor deposition method, or the like. For example, the electrode film is formed of a single layer film made of metal such as gold, or a laminated film, which has metal such as chromium as a foundation layer, and metal such as gold as an upper layer.

Subsequently, a mask (hereinafter referred to as an "electrode mask") made of a resist material having a shape corresponding to the outer shapes of the electrodes 41 through 48 is formed on the surface of the electrode film using the photolithography technology.

Then, an etching process is performed on the electrode film to selectively remove the electrode film in the areas not masked by the electrode mask. Thus, the excitation electrodes 41, 42 (see FIG. 5), the mount electrodes 43, 44 (see FIG. 5), and the wiring electrode 45, 46 (see FIG. 5) are formed on each of the piezoelectric plates 30. In addition, the extending electrodes 47, 48 are formed in an area extending from each of the piezoelectric plates 30 to the frame part 62 through the connection part 70 and the connecting part 61.

The first extending electrode 47 extends in the Y-axis direction. The first extending electrode 47 is disposed on the −X-axis direction side of the central axis O (see FIG. 5). In each of the connection parts 70, the first extending electrode 47 is disposed on the side surface on the −X-axis direction side of the main body part 71, and the tilted surface 72a (see FIG. 10) of the first guide part 72. The end part on the −Y-axis direction side of the first extending electrode 47 is connected to a first pad part 47a having a rectangular shape and disposed on the principal surface of the frame part 62. The end part on the +Y-axis direction side of the first extending electrode 47 is connected to the first wiring electrode 45 disposed on the principal surface of the base part 35.

The second extending electrode 48 extends in the Y-axis direction at the position distant in the +X-axis direction from the first extending electrode 47. The second extending electrode 48 is disposed on the +X-axis direction side of the central axis O (see FIG. 5). In each of the connection parts 70, the second extending electrode 48 is disposed on the side surface on the +X-axis direction side of the main body part 71, and the tilted surface 73a (see FIG. 6) of the second guide part 73. The end part on the −Y-axis direction side of the second extending electrode 48 is connected to a second pad part 48a having a rectangular shape and disposed on the +X-axis direction side of the first pad part 47a in the principal surface of the frame part 62. The end part on the +Y-axis direction side of the second extending electrode 48 is connected to the second wiring electrode 46 disposed on the principal surface of the base part 35.

The pad parts 47a, 48a are disposed in accordance with the piezoelectric plate 30, and a plurality of pad parts 47a, 48a (just one pair are shown in FIG. 9) is disposed so as to be alternately arranged in the X-axis direction. It should be noted that the positions of the pad parts 47a, 48a are not particularly limited, but the pad parts 47a, 48a can be disposed at positions overlapping the piezoelectric plate 30 in the X-axis direction, or can also be disposed at positions corresponding to an area between two piezoelectric plates 30 adjacent in the X-axis direction to each other.

[Weight Metal Film Forming Process]

Subsequently, the weight metal film forming process S30 is performed. As shown in FIG. 5, in the weight metal film formation process S30, the weight metal films 50 used for the frequency adjustment are formed on the weight parts 31B, 32B of the vibrating arm parts 31, 32. For example, the weight metal film 50 is formed by vapor deposition. It should be noted that the weight metal films 50 can also be formed at the same time as the electrodes 41 through 48 in the electrode forming process S20.

[Frequency Adjusting Process]

Subsequently, the frequency adjusting process S40 is performed. In the frequency adjusting process S40, a predetermined drive voltage is applied between the extending electrodes 47, 48 to vibrate the vibrating arm parts 31, 32 to thereby adjust the frequency of the piezoelectric vibrator element 3 (the piezoelectric plate 30).

Specifically, as shown in FIG. 9, probes or the like of a measurement instrument for applying the drive voltage are pressed against the pad parts 47a, 48a. In this state, the predetermined drive voltage is applied between the excitation electrodes 41, 42 (see FIG. 5) via the extending electrodes 47, 48 to vibrate the vibrating arm parts 31, 32. The weight metal films 50 (see FIG. 5) on the respective vibrating arm parts 31, 32 are partially removed in accordance with a difference between the frequency measured on this occasion and a predetermined target frequency of the piezoelectric vibrator element 3. Thus, since the mass of each of the vibrating arm parts 31, 32 varies, the frequency (the frequency of the piezoelectric vibrator element 3) of the vibration of the vibrating arm parts 31, 32 varies. Therefore, it is possible to approximate the frequency of the piezoelectric vibrator element 3 to the target frequency.

[Segmentalizing Process]

Subsequently, the segmentalizing process S50 is performed. In the segmentalizing process S50, the connection parts 70 are cut to segmentalize the piezoelectric plates 30.

Specifically, each of the piezoelectric vibrator element 3 is broken off from the frame part 62 at the connection part 70. As described above, since the width of the connection part 70 is the narrowest in the part between the frame part 62 and the end edge on the −Y-axis direction side of the base part 35, if the piezoelectric plate 30 is bent with respect to the frame part 62, the piezoelectric plate 30 is cut out at the connection part 70.

Due to the processes described hereinabove, the plurality of piezoelectric vibrator elements 3 can be manufactured in a lump from the single wafer 60. It should be noted that the piezoelectric vibrator elements 3 are broken off from the frame part 62 at the connection part 70, then land on a mounting stage not shown, and are then conveyed to the next process while being suction supported.

[Function of Connection Part when Breaking Off Piezoelectric Vibrator Element]

Figure 10:
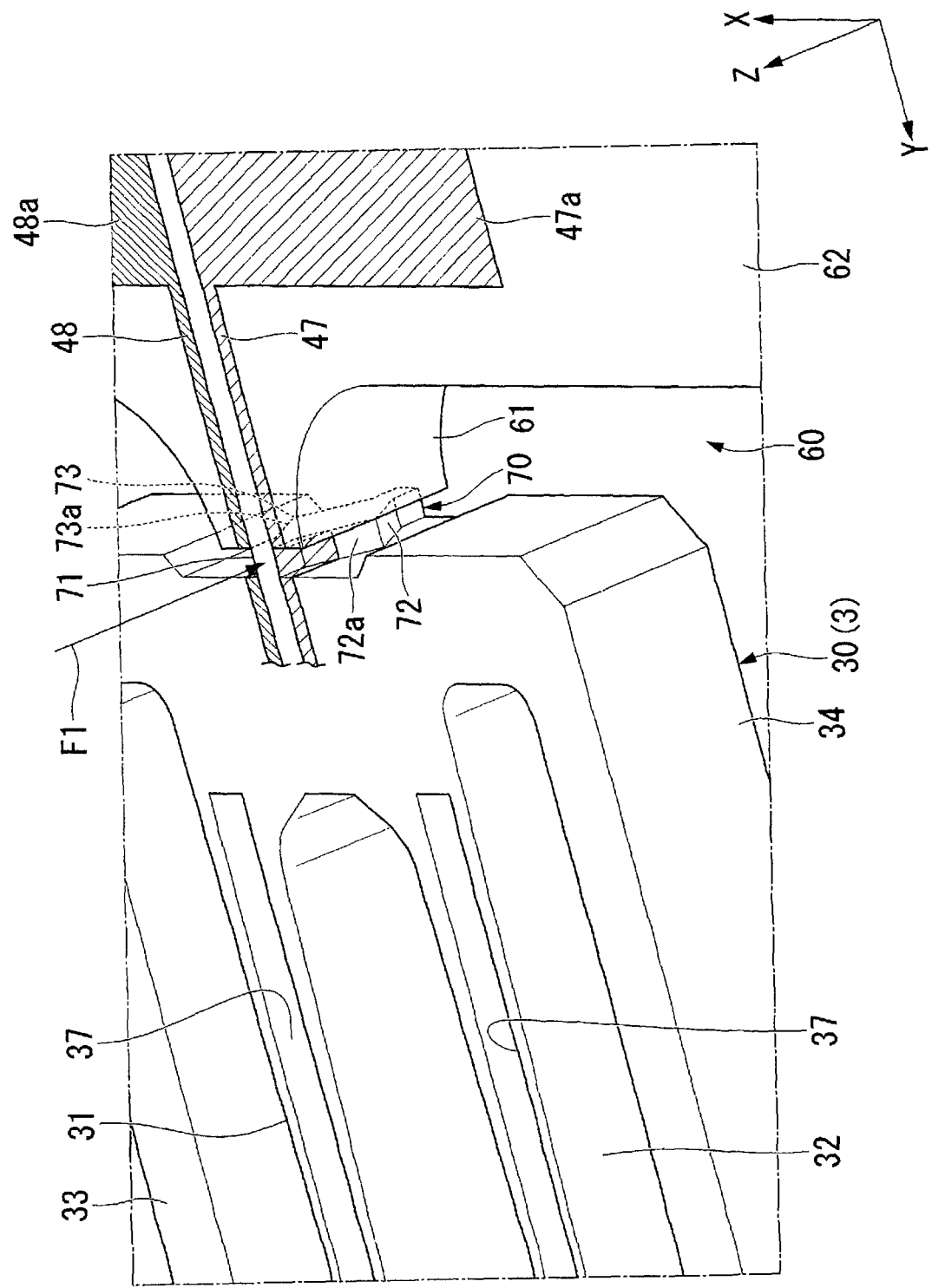
FIG. 10 is a perspective view of the connection part of the wafer according to the embodiment.

As shown in FIG. 10, when breaking off the piezoelectric vibrator element 3, the force is applied to the connection part 70 from one surface side in the thickness direction of the connection part 70. Specifically, when breaking off the piezoelectric vibrator element 3, the force is applied to the main body part 71 in the direction of an arrow F1 (i.e., from the +Z-axis direction side toward the −Z-axis direction side).

Figure 11:
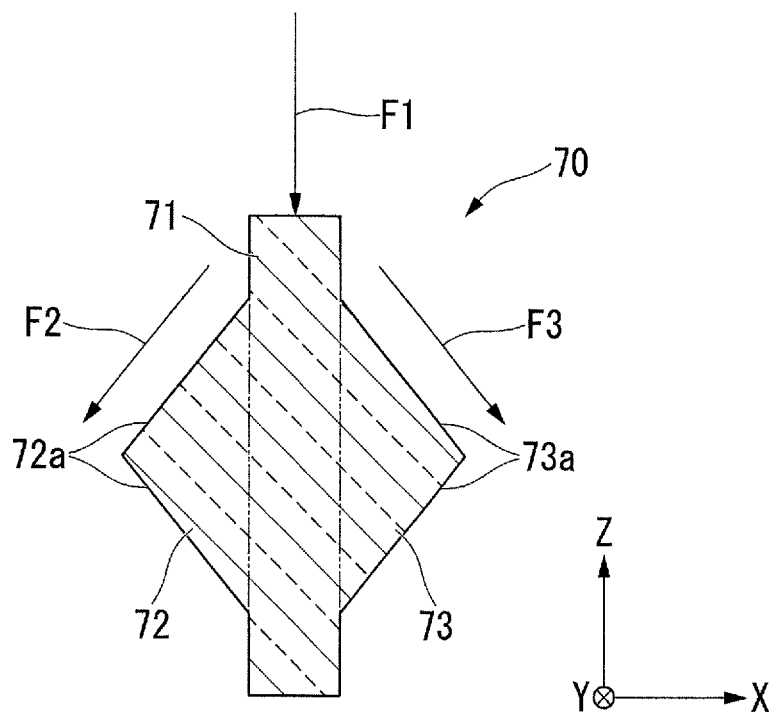
FIG. 11 is an explanatory diagram of a function of the connection part when breaking off the piezoelectric vibrator element.

FIG. 11 is an XI-XI cross-sectional view (i.e., a cross-sectional view of the connection part 70) in FIG. 9. In FIG. 11, the extending electrodes 47, 48 are omitted from the drawing for the sake of convenience.

As shown in FIG. 11, when breaking off the piezoelectric vibrator elements 3, the guide parts 72, 73 guide the force (the force applied in the direction of the arrow F1), which is applied thereto from the one surface side in the thickness direction of the connection part 70, to at least one side in the width direction of the connection part 70. The first guide part 72 guides the force applied thereto in the direction of the arrow F1 toward the direction of an arrow F2 along the tilted surface 72*a*. The second guide part 73 guides the force applied thereto in the direction of the arrow F1 toward the direction of an arrow F3 along the tilted surface 73*a*.

As described hereinabove, in the wafer 60, the piezoelectric vibrator element 3, and the piezoelectric vibrator 1 according to the present embodiment, the connection part 70 is provided with the guide parts 72, 73 for guiding the force, which is applied thereto from the one surface side in the thickness direction of the connection part 70 when breaking off the piezoelectric vibrator element 3 from the frame part 62 at the connection part 70, to at least one side in the width direction of the connection part 70.

Incidentally, in the conventional wafers, in the case in which the piezoelectric vibrator elements are miniaturized, the way of cracking the connection part when breaking off the piezoelectric vibrator element becomes apt to vary. Therefore, the landing posture of the piezoelectric vibrator element on the mounting stage becomes apt to vary. If the landing posture of the piezoelectric vibrator element is inappropriate, it becomes difficult to suction support and convey the piezoelectric vibrator element, and there is a possibility that the yield ratio decreases. Therefore, there is a room for improvement in stably breaking off the piezoelectric vibrator element.

In contrast, according to the present embodiment, since the force applied thereto from the one surface side in the thickness direction of the connection part 70 when breaking off the piezoelectric vibrator element 3 is guided to at least one side in the width direction of the connection part 70, the way of cracking the connection part 70 becomes apt to be stabilized. Therefore, it is possible to stably break off the piezoelectric vibrator element 3. In addition, since the way of cracking the connection part 70 is stabilized when breaking off the piezoelectric vibrator element 3, the landing posture of the piezoelectric vibrator element 3 on the mounting stage becomes apt to be stabilized. Therefore, it becomes easy to suction support and convey the piezoelectric vibrator element, and thus, it is possible to prevent the yield ratio from dropping.

Further, in the present embodiment, the guide parts 72, 73 respectively have the tilted surfaces 72*a*, 73*a* tilted with respect to the one surface in the thickness direction of the connection part 70 the inner side of each of the tilted surfaces 72*a*, 73*a* in the thickness direction of the connection part 70 is located on the outer side in the width direction of the connection part 70.

According to the present embodiment, since the force applied thereto from the one surface side in the thickness direction of the connection part 70 when breaking off the piezoelectric vibrator element 3 is guided along the tilted surfaces 72*a*, 73*a*, the way of cracking the connection part 70 becomes more apt to be stabilized. Therefore, it is possible to more stably break off the piezoelectric vibrator element 3.

Further, if the wet-etching process is performed on the quartz crystal in the outer shape forming process, an irregularly-shaped part formed of the natural crystal surface of the piezoelectric material is formed on the side surface in the width direction of the connection part 70 as the etching residue in some cases. For example, the irregularly-shaped parts are formed on the both side surfaces in the width direction of the connection part 70, respectively. The surface of the irregularly-shaped part is formed as a surface tilted with respect to the principal surface of the wafer 60. In other words, the surface of the irregularly-shaped part is a surface tilted with respect to one surface in the thickness direction of the connection part 70. Therefore, according to the present embodiment, the surfaces of the irregularly-shaped parts can be used as the tilted surfaces 72*a*, 73*a* of the guide parts 72, 73, which is preferable.

Further, in the present embodiment, in the cross-sectional view of the connection part 70, the guide parts 72, 73 each have a triangular shape having the vertex angle K on the outer side in the width direction of the connection part 70.

Incidentally, in the case of simply adopting a rectangular shape as the cross-sectional shape of the connection part 70, when breaking off the piezoelectric vibrator element 3, the way of cracking the connection part 70 is not fixed, and there is a high possibility that the piezoelectric vibrator element 3 cannot stably be broken off. In contrast, according to the present embodiment, the guide parts 72, 73 each have the triangular shape having the vertex angle K on the outer side in the width direction of the connection part 70 in the cross-sectional view of the connection part 70. Therefore, since the cracks are guided along the oblique sides of the triangular shapes when breaking off the piezoelectric vibrator element 3, the way of cracking the connection part 70 becomes more apt to be stabilized. Therefore, it is possible to more stably break off the piezoelectric vibrator element 3.

Further, in the present embodiment, the degree of the vertex angle K is no smaller than 30 degrees and no larger than 120 degrees.

Incidentally, in the case in which the degree of the vertex angle K exceeds 120 degrees, the width of the guide parts 72, 73 in the width direction of the connection part 70 becomes too thin, and there is a high possibility that the connection part 70 breaks in an unintended situation due to insufficient strength. On the other hand, in the case in which the degree of the vertex angle K is smaller than 30 degrees, the thickness of the guide parts 72, 73 in the thickness direction of the connection part 70 becomes too thin, and there is a high possibility that the connection part 70 breaks in an unintended situation due to insufficient strength. In contrast, according to the present embodiment, since the degree of the vertex angle K is no smaller than 30 degrees and no larger than 120 degrees, the strength of the connection part 70 is sufficiently ensured. Therefore, it is possible to prevent the connection part 70 from breaking in an unintended situation.

Further, in the present embodiment, in the cross-sectional view of the connection part 70, the connection part 70 is further provided with the main body part 71 having the rectangular shape, and the guide parts 72, 73 are disposed on the both side surfaces in the width direction of the main body part 71. In other words, the guide parts 72, 73 include the first guide part 72 disposed on one side surface in the width direction of the main body part 71, and the second guide part 73 disposed on the other side surface in the width direction of the main body part 71.

According to the present embodiment, since the force applied thereto from the one surface side in the thickness direction of the connection part 70 when breaking off the piezoelectric vibrator element 3 is guided to the both sides in the width direction of the connection part 70 starting from the main body part 71, the way of cracking the connection part 70 becomes more apt to be stabilized. Therefore, it is possible to more stably break off the piezoelectric vibrator element 3.

Further, in the present embodiment, in the cross-sectional view of the connection part 70, the main body part 71 projects from the guide parts 72, 73 outward in the thickness direction of the connection part 70.

According to the present embodiment, since the force applied thereto from the one surface side in the thickness direction of the connection part 70 when breaking off the piezoelectric vibrator element 3 is guided to at least one side in the width direction of the connection part 70 starting from the projected part of the main body part 71, the way of cracking the connection part 70 becomes more apt to be stabilized. Therefore, it is possible to more stably break off the piezoelectric vibrator element 3.

Further, in the present embodiment, in the cross-sectional view of the connection part 70, the first guide part 72 and the second guide part 73 form a line-symmetrical shape with the central line L1 in the width direction of the main body part 71 as the line of symmetry.

According to the present embodiment, since the force applied thereto from the one surface side in the thickness direction of the connection part 70 when breaking off the piezoelectric vibrator element 3 is guided to the both sides in the width direction of the connection part 70 in a balanced manner starting from the main body part 71, the way of cracking the connection part 70 becomes more apt to be stabilized. Therefore, it is possible to more stably break off the piezoelectric vibrator element 3.

Further, in the present embodiment, defining the width of the connection part 70 as W1, and the width of the main body part 71 as W2 in the cross-sectional view of the connection part 70, the following is fulfilled.

$$10\ \mu m < W2 \times 2 < W1 < 100\ \mu m$$

Incidentally, in the case in which the width W1 of the connection part 70 is equal to or larger than 100 µm, the crack becomes apt to start from the guide parts 72, 73 when breaking off the piezoelectric vibrator element 3, and there is a high possibility that the piezoelectric vibrator element 3 cannot stably be broken off. On the other hand, in the case in which the width W2 of the main body part 71 is equal to or smaller than 10 µm, the width of the main body part 71 becomes too thin, and there is a high possibility that the connection part 70 breaks in an unintended situation due to the insufficient strength. Further, in the case in which W2×2≥W1 is fulfilled, the width of the connection part 70 becomes too thin, and there is a high possibility that the connection part 70 breaks in an unintended situation due to insufficient strength. In contrast, according to the present embodiment, since the following is fulfilled, it becomes hard for the cracks to start from the guide parts 72, 73 when breaking off the piezoelectric vibrator element 3.

$$10\ \mu m < W2 \times 2 < W1 < 100\ \mu m$$

In other words, since the crack becomes apt to occur starting from the main body part 71 when breaking off the piezoelectric vibrator element 3, it is possible to stably break off the piezoelectric vibrator element 3. In addition, since the strength of the connection part 70 is sufficiently ensured, it is possible to prevent the connection part 70 from breaking in an unintended situation.

Further, in the present embodiment, there are further provided the pair of extending electrodes 47, 48 electrically connected to the pair of excitation electrodes 41, 42, which vibrate the pair of vibrating arm parts 31, 32 when the predetermined drive voltage is applied thereto, wherein the first extending electrode 47 (one of the pair of extending electrodes 47, 48) is disposed on the one side surface in the width direction of the connection part 70, and the second extending electrode 48 (the other of the pair of extending electrodes 47, 48) is disposed on the other side surface in the width direction of the connection part 70.

According to this configuration, since it is possible to prevent the pair of extending electrodes 47, 48 from coming close to each other compared to the case of disposing both of the pair of extending electrodes 47, 48 on one surface in the thickness direction of the connection part 70, it is possible to prevent the pair of extending electrodes 47, 48 from shorting to each other. In addition, since the width of the connection part 70 can be made narrower, it is possible to easily break off the piezoelectric vibrator element 3. Therefore, it is possible to prevent the piezoelectric vibrator element 3 from being damaged when breaking off the piezoelectric vibrator element 3.

Figure 12:
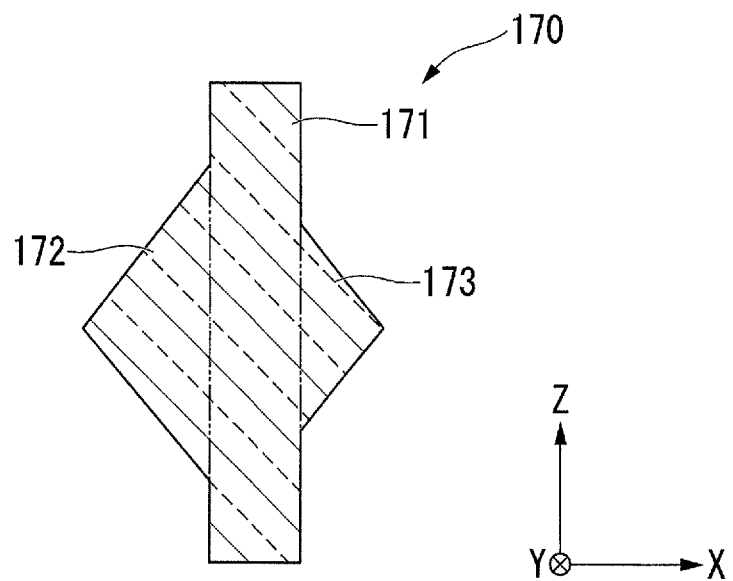
FIG. 12 is a cross-sectional view of the connection part related to a first modified example of the embodiment.
Figure 13:
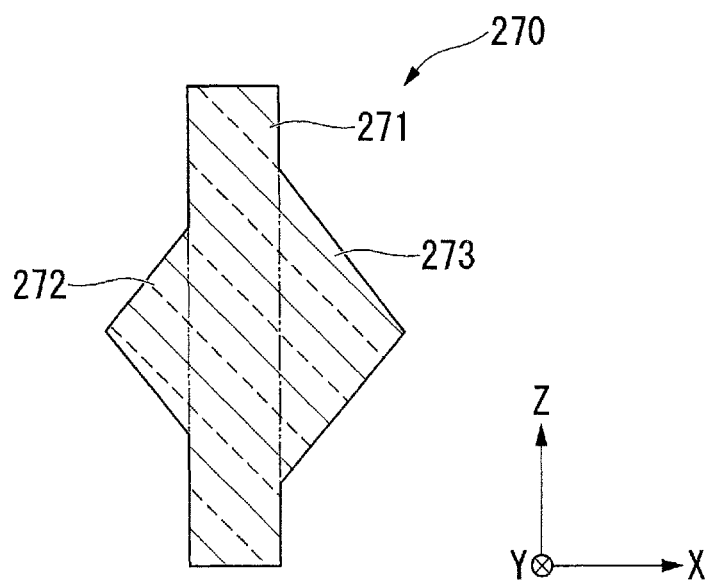
FIG. 13 is a cross-sectional view of the connection part related to a second modified example of the embodiment.

It should be noted that in the present embodiment, there is presented the description citing the example in which the first guide part 72 and the second guide part 73 form a line-symmetrical shape with the central line L1 in the width direction of the main body part 71 as the line of symmetry in the cross-sectional view of the connection part 70, but the invention is not limited to this example. For example, as shown in FIG. 12, it is also possible for a first guide part 172 and a second guide part 173 to have respective shapes different from each other in the cross-sectional view of a connection part 170. In the modified example shown in FIG. 12, the outer shape of the first guide part 172 is made larger than the outer shape of the second guide part 173 in the cross-sectional view of the connection part 170. In contrast, in the modified example shown in FIG. 13, the outer shape of a first guide part 272 is made smaller than the outer shape of a second guide part 273 in the cross-sectional view of a connection part 270.

According to these modified examples, since the force applied thereto from the one surface side in the thickness direction of the connection part 170 when breaking off the piezoelectric vibrator element 3 becomes apt to be guided to just one side in the width direction of the connection part 170 starting from a main body part 171, the crack becomes apt to occur in a local area (i.e., a brittle part of the connection part 170) of the connection part 170. Therefore, it is possible to easily break off the piezoelectric vibrator element 3. Therefore, it is possible to prevent the piezoelectric vibrator element 3 from being damaged when breaking off the piezoelectric vibrator element 3.

Further, if the wet-etching process is performed on the quartz crystal in the outer shape forming process, an irregularly-shaped part formed of the natural crystal surface of the piezoelectric material is formed on the side surface in the width direction of the connection part 170 as the etching residue in some cases. For example, the irregularly-shaped parts are formed on the both side surfaces in the width direction of the connection part 170, respectively. The surface of each of the irregularly-shaped parts is formed as a surface tilted with respect to the principal surface of the wafer 60. The irregularly-shaped parts are formed asymmetrically between the −X-axis direction side and the +X-axis direction side. Therefore, according to the present embodiment, the guide parts 172, 173 can be formed using the asymmetric property in the X-axis direction of the irregularly-shaped parts, which is preferable.

Figure 14:
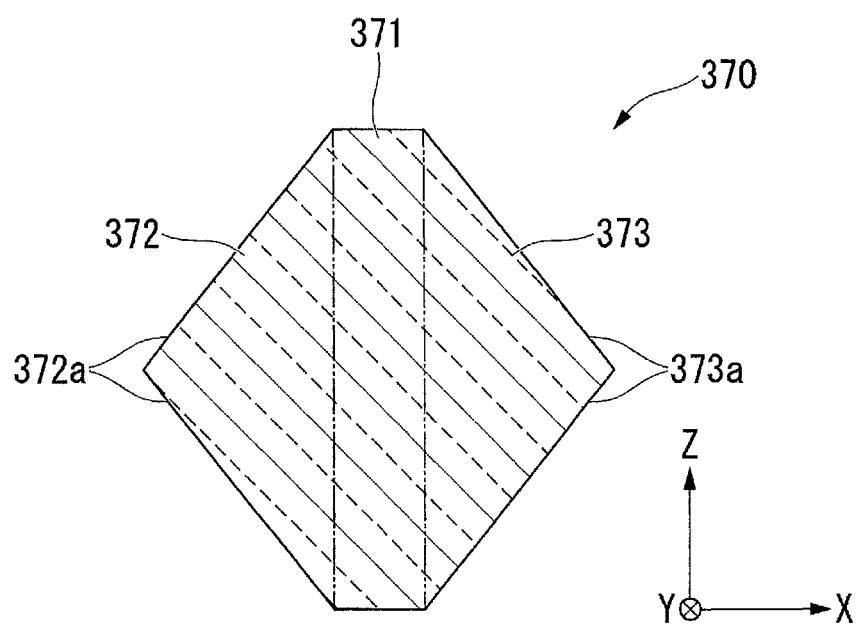
FIG. 14 is a cross-sectional view of the connection part related to a third modified example of the embodiment.

Further, in the present embodiment, there is presented the description citing the example in which the main body part 71 projects from the guide parts 72, 73 outward in the thickness direction of the connection part 70 in the cross-sectional view of the connection part 70, but the invention is not limited to this example. For example, as shown in FIG. 14, it is also possible for the end edge of one surface in the thickness direction of a main body part 371 to have contact with the end edge of each of tilted surfaces 372*a*, 373*a* of guide parts 372, 373 in the cross-sectional view of a connection part 370. In the modified example shown in FIG. 14, the outer shape of the first guide part 372 and the outer shape of the second guide part 373 form substantially the same shape in the cross-sectional view of the connection part 370.

Figure 15:
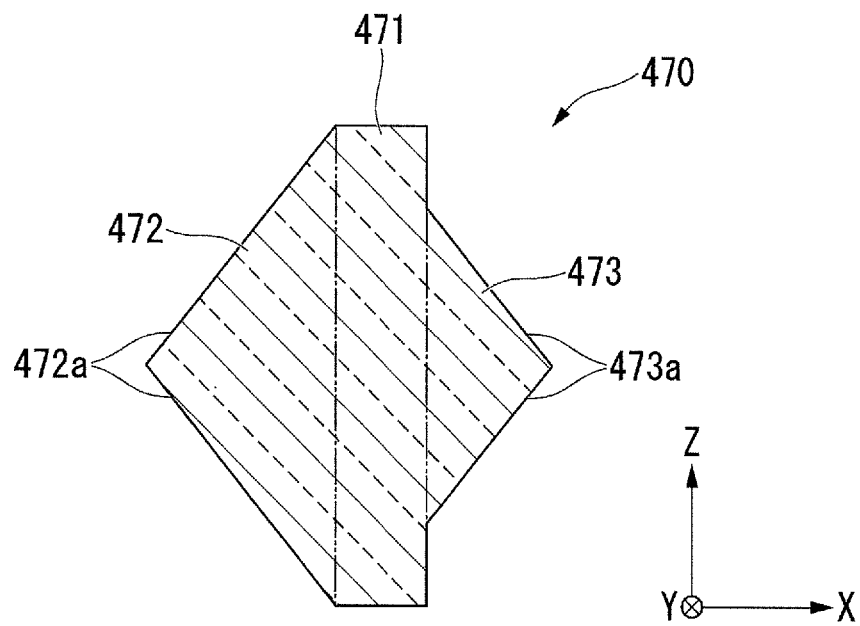
FIG. 15 is a cross-sectional view of the connection part related to a fourth modified example of the embodiment.
Figure 16:
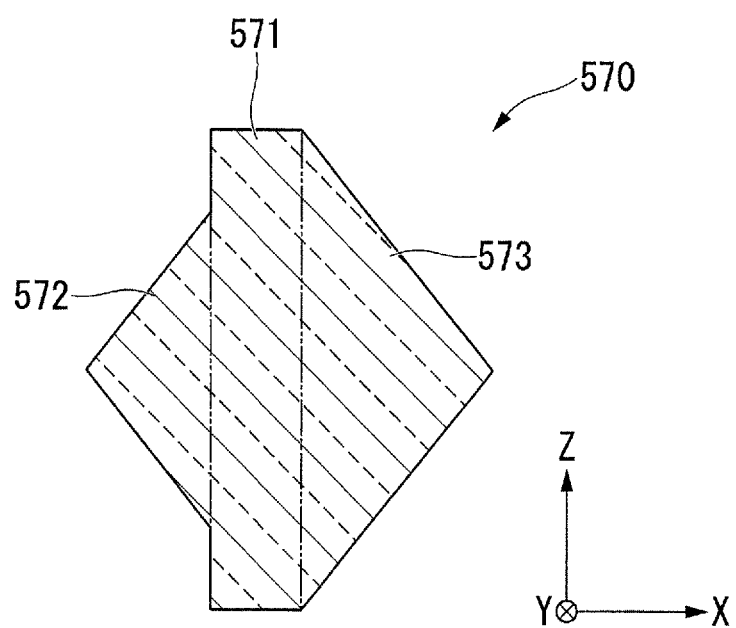
FIG. 16 is a cross-sectional view of the connection part related to a fifth modified example of the embodiment.

Further, as shown in FIG. 15, it is also possible for the end edge of one surface in the thickness direction of a main body part 471 to have contact with only the end edge of a tilted surface 472*a* of a first guide part 472 in the cross-sectional view of a connection part 470. In other words, it is also possible for the end edge of the one surface in the thickness direction of the main body part 471 to be distant from the end edge of a tilted surface 473*a* of a second guide part 473. In the modified example shown in FIG. 15, the first guide part 472 and the second guide part 473 have respective shapes different from each other in the cross-sectional view of the connection part 470. In the modified example shown in FIG. 15, the outer shape of the first guide part 472 is made larger than the outer shape of the second guide part 473 in the cross-sectional view of the connection part 470. In contrast, in the modified example shown in FIG. 16, the outer shape of a first guide part 572 is made smaller than the outer shape of a second guide part 573 in the cross-sectional view of a connection part 570.

Further, in the present embodiment, there is presented the description citing the example in which the connection part 70 is further provided with the main body part 71 having the rectangular shape, and the guide parts 72, 73 are respectively disposed on the both side surfaces in the width direction of the main body part 71 in the cross-sectional view of the connection part 70, but the invention is not limited to this example. For example, it is also possible for the guide part to be disposed on one side surface in the width direction of the main body part 71. In other words, it is sufficient for the guide part to be disposed on at least one of the one side surface and the other side surface in the width direction of the main body part 71.

It should be noted that the invention is not limited to the above embodiment described with reference to the drawings, but a variety of modified examples can be cited within the scope or the spirit of the invention.

For example, in the example described above, the piezoelectric vibrator element 3 is a so-called side-arm vibrator element having the support arm parts 33, 34 disposed on the outer side of the vibrating arm parts 31, 32. However, this configuration is not a limitation, but the piezoelectric vibrator element can also be, for example, a so-called center-arm vibrator element having a single support arm part disposed between the pair of vibrating arm parts, or a vibrator element not provided with any support arm part. Further, the vibrating arm part is not required to be provided with the groove parts.

Besides the above, it is arbitrarily possible to replace the constituent in the embodiment described above with a known constituent within the scope or the spirit of the invention.

What is claimed is:

1. A wafer comprising:
   a piezoelectric vibrator element;
   a frame part; and
   a connection part adapted to connect the piezoelectric vibrator element and the frame part to each other,
   wherein the connection part includes a guide part adapted to guide a force, applied in a thickness direction of the connection part at one side of the connection part to at least one other side of the connection part in a width direction, when breaking off the piezoelectric vibrator element from the frame part at the connection part,
   wherein the guide part has a tilted surface tilted with respect to the thickness direction of the connection part so that an inner side of the tilted surface is located on an outer side in the width direction of the connection part.

2. The wafer according to claim 1, wherein the guide part has a triangular shape having a vertex angle on an outer side in the width direction of the connection part in a cross-sectional view of the connection part.

3. The wafer according to claim 1, wherein the connection part further includes a main body part having a rectangular shape in a cross-sectional view of the connection part, and the guide part is on at least one side surface in a width direction of the main body part.

4. The wafer according to claim 3, wherein the main body part projects outward in the thickness direction of the connection part from the guide part.

5. The wafer according to claim 3, wherein the guide part includes a first guide part disposed on one side surface in the width direction of the main body part, and a second guide part disposed on an opposite side surface in the width direction of the main body part.

6. The wafer according to claim 3, wherein a width of the connection part is defined as W1 and a width of the main body part is defined as W2 in the cross-sectional view of the connection part, and 10 μm<W2×2<W1<100 μm.

7. The wafer according to claim 1, further comprising:
a pair of extending electrodes electrically connected to a pair of excitation electrodes, which are adapted to vibrate a pair of vibrating arm parts of the piezoelectric vibrator element when a predetermined drive voltage is applied to the pair of excitation electrodes,
wherein one of the pair of extending electrodes is on one side surface in the width direction of the connection part, and
the other of the pair of extending electrodes is on the other side surface in the width direction of the connection part.

8. A piezoelectric vibrator element comprising:
a pair of vibrating arm parts;
a base part connecting base ends of the pair of vibrating arm parts to each other; and
a connection part connected to the base part,
wherein the connection part includes a guide part adapted to guide a force applied in a thickness direction of the connection part at one side of the connection part to at least one other side of the connection part in a width direction,
wherein the guide part has a tilted surface tilted with respect to the thickness direction of the connection part so that an inner side of the tilted surface is located on an outer side in the width direction of the connection part.

9. The piezoelectric vibrator element according to claim 8, wherein the guide part has a triangular shape having a vertex angle on an outer side in the width direction of the connection part in a cross-sectional view of the connection part.

10. The piezoelectric vibrator element according to claim 9, wherein a degree of the vertex angle is 30 degrees to 120 degrees.

11. The piezoelectric vibrator element according to claim 8, wherein the connection part further includes a main body part having a rectangular shape in a cross-sectional view of the connection part, and the guide part is on at least one side surface in a width direction of the main body part.

12. The piezoelectric vibrator element according to claim 11, wherein the main body part projects outward in the thickness direction of the connection part from the guide part.

13. The piezoelectric vibrator element according to claim 11, wherein the guide part includes a first guide part on one side surface in the width direction of the main body part, and a second guide part on an opposite side surface in the width direction of the main body part.

14. The piezoelectric vibrator element according to claim 13, wherein the first guide part and the second guide part form a line-symmetrical shape with a central line in the width direction of the main body part as a line of symmetry in the cross-sectional view of the connection part.

15. The piezoelectric vibrator element according to claim 13, wherein the first guide part and the second guide part have respective shapes different from each other in the cross-sectional view of the connection part.

16. The piezoelectric vibrator element according to claim 11, wherein a width of the connection part is defined as W1 and a width of the main body part is defined as W2 in the cross-sectional view of the connection part, and 10 μm<W2×2<W1<100 μm.

17. The piezoelectric vibrator element according to claim 8, further comprising:
a pair of extending electrodes electrically connected to a pair of excitation electrodes, which are adapted to vibrate a pair of vibrating arm parts when a predetermined drive voltage is applied to the pair of excitation electrodes,
wherein one of the pair of extending electrodes is on one side surface in the width direction of the connection part, and
the other of the pair of extending electrodes is on the other side surface in the width direction of the connection part.

18. A piezoelectric vibrator comprising:
the piezoelectric vibrator element according to claim 8; and
a package adapted to house the piezoelectric vibrator element.

* * * * *